(12) United States Patent
Sibbach et al.

(10) Patent No.: US 12,264,588 B2
(45) Date of Patent: Apr. 1, 2025

(54) LIQUID FLUID SYSTEMS INCLUDING PHASE DETECTION SENSORS FOR TURBINE ENGINES

(71) Applicant: General Electric Company, Schenectady, NY (US)

(72) Inventors: Arthur William Sibbach, Boxford, MA (US); Brandon Wayne Miller, Liberty Township, OH (US)

(73) Assignee: General Electric Company, Evendale, OH (US)

( * ) Notice: Subject to any disclaimer, the term of this patent is extended or adjusted under 35 U.S.C. 154(b) by 421 days.

(21) Appl. No.: 17/687,976

(22) Filed: Mar. 7, 2022

(65) Prior Publication Data

US 2023/0279784 A1 Sep. 7, 2023

(51) Int. Cl.
*F01D 21/00* (2006.01)
*F02C 9/28* (2006.01)
*H03H 9/00* (2006.01)

(52) U.S. Cl.
CPC .............. *F01D 21/003* (2013.01); *F02C 9/28* (2013.01); *H03H 9/0009* (2013.01); *H03H 9/0014* (2013.01); *F05D 2270/3015* (2013.01); *F05D 2270/303* (2013.01); *F05D 2270/333* (2013.01); *F05D 2270/804* (2013.01)

(58) Field of Classification Search
CPC .. F01D 21/003; F02C 9/28; F02C 7/12; F02C 7/14; F02C 7/18; F02C 7/224; F02C 7/22; F02C 7/141; F02C 9/40; F02C 3/20; H03H 9/0009; H03H 9/0014; F05D 2270/3015; F05D 2270/303; F05D 2270/333; F05D 2270/804; F05D 2260/207;
(Continued)

(56) References Cited

U.S. PATENT DOCUMENTS 3,039,305 A   6/1962  Hall
4,756,854 A   7/1988  Wegrzyn
(Continued)

FOREIGN PATENT DOCUMENTS

CA       885178 A    11/1971
CN      1627063 A     6/2005
(Continued)

OTHER PUBLICATIONS

Devkota J, Ohodnicki PR, Greve DW. SAW Sensors for Chemical Vapors and Gases. Sensors. 2017; 17(4):801. https://doi.org/10.3390/s17040801 (Year: 2017).*
(Continued)

*Primary Examiner* — Eric S. McCall
*Assistant Examiner* — Timothy P Graves
(74) *Attorney, Agent, or Firm* — Dority & Manning, P.A.

(57) ABSTRACT

A liquid fuel system for a turbine engine may include one or more sensors configured to generate sensor outputs corresponding to one or more phase properties of a fuel supplied to the turbine engine through a fuel pathway, and a controller configured to generate control commands configured to control one or more controllable components of the liquid fuel system based at least in part on the sensor outputs. The one or more sensors may include one or more phase detection sensors. The fuel may include hydrogen. The fuel may have a liquid phase state.

7 Claims, 13 Drawing Sheets

(58) Field of Classification Search
CPC ........ F05D 2260/213; F05D 2270/301; G01M 15/14; G01N 25/12
USPC .................................................. 60/734, 730
See application file for complete search history.

(56) References Cited

U.S. PATENT DOCUMENTS

| | | | |
|---|---|---|---|
| 4,784,959 | A | 11/1988 | Wegrzyn |
| 4,822,743 | A | 4/1989 | Wegrzyn |
| 4,844,743 | A | 7/1989 | Koblenzer et al. |
| 6,984,465 | B2 | 1/2006 | Canepa et al. |
| 7,192,459 | B2 | 3/2007 | Puri et al. |
| 7,752,885 | B2 | 7/2010 | Huang |
| 7,811,688 | B2 | 10/2010 | Flynn et al. |
| 7,915,047 | B2 | 3/2011 | Thorn et al. |
| 8,113,708 | B2 | 2/2012 | Albertson |
| 8,319,833 | B2 | 11/2012 | Weinstein et al. |
| 8,394,553 | B2 | 3/2013 | Flynn et al. |
| 8,470,933 | B2 | 6/2013 | Thorn et al. |
| 8,778,545 | B2 | 7/2014 | Lehar et al. |
| 8,858,679 | B2 | 10/2014 | Buhrman et al. |
| 9,022,730 | B2 | 5/2015 | Vysohlid et al. |
| 9,239,008 | B2 | 1/2016 | Ekanayake et al. |
| 9,269,205 | B1 | 2/2016 | Lamkin et al. |
| 9,318,757 | B2 | 4/2016 | Koenig et al. |
| 9,683,910 | B2 | 6/2017 | Ekanayake et al. |
| 10,112,486 | B2 | 10/2018 | Ban et al. |
| 10,222,291 | B2 | 3/2019 | Thompson et al. |
| 10,286,336 | B2 | 5/2019 | Durward |
| 10,286,408 | B2 | 5/2019 | Lam et al. |
| 10,386,259 | B2 | 8/2019 | Zhang et al. |
| 10,473,031 | B2 | 11/2019 | Ellsworth et al. |
| 10,578,585 | B1 | 3/2020 | Gerardi et al. |
| 10,584,616 | B2 | 3/2020 | Moxon |
| 10,584,635 | B2 | 3/2020 | Armstrong et al. |
| 10,823,066 | B2 | 11/2020 | Miller et al. |
| 11,073,169 | B2 | 7/2021 | Thatte |
| 11,125,165 | B2 | 9/2021 | Niergarth et al. |
| 11,139,491 | B2 | 10/2021 | Kwon et al. |
| 2006/0257094 | A1 | 11/2006 | McEvoy et al. |
| 2013/0139897 | A1 | 6/2013 | Kim et al. |
| 2015/0101419 | A1 | 4/2015 | Hill et al. |
| 2018/0058972 | A1* | 3/2018 | Zhang .................... G01M 15/14 |
| 2019/0003386 | A1 | 1/2019 | Stapp |
| 2020/0340881 | A1 | 10/2020 | Hattori |
| 2020/0348662 | A1 | 11/2020 | Cella et al. |
| 2021/0148283 | A1 | 5/2021 | Niergarth et al. |

FOREIGN PATENT DOCUMENTS

| | | | | |
|---|---|---|---|---|
| CN | 200990131 Y | | 12/2007 | |
| EP | 0824022 A1 | * | 8/1996 | .......... A61M 5/1408 |
| EP | 3805107 A1 | | 4/2021 | |
| JP | 2014025741 A | | 2/2014 | |
| WO | WO2011119338 A1 | | 9/2011 | |

OTHER PUBLICATIONS

Drafts, Acoustic Wave Technology, 2000, https://www.fierceelectronics.com/components/acoustic-wave-technology-sensors (Year: 2000).*

Proceedings vol. 7314, Photonics in the Transportation Industry: Auto to Aerospace II; 73140A (2009) https://doi.org/10.1117/12.821374 Event: SPIE Defense, Security, and Sensing, 2009, Orlando, Florida, United States Optical fiber sensors (Year: 2009).*

Drafts, Acoustic Wave Technology Sensors, Fierce Electronics, Oct. 2000, 17 Pages.

Ke et al., Detecting Phase Transitions in Supercritical Mixtures: An Enabling Tool for Greener Chemical Reactions, Proceedings of the Royal Society A, vol. 466, 2010, pp. 2799-2812.

Ke et al., The Phase Equilibrium and Density Studies of the Ternary Mixtures of $CO_2 + Ar + N_2$ and $CO_2 + Ar + H_2$, Systems Relevance to CCS Technology, International Journal of Greenhouse Gas Control, vol. 56, Jan. 2017, pp. 55-56.

Fandino et al., Phase Behavior of ($CO_2 + H_2$) and ($CO_2 + N_2$) at Temperatures Between (218.15 and 303.15) K at Pressures up to 15 MPa, International Journal of Greenhouse Gas Control, vol. 36, May 2015, 39 Pages.

Fehrm, Bjorn's Corner: The Challenges of Hydrogen. Part 29. Gas Turbine Heat Management, Mar. 19, 2021, 3 Pages. Accessed on-line at: https://leehamnews.com/2021/03/19/bjorns-corner-the-challenges-of-hydrogen-part-29-gas-turbine-heat-management/.

Gonzalez-Portillo, A New Concept in Thermal Engineering Optimization: The Pericritical Cycle with Multi-Heating and Its Application to Concentrating Solar Power, Sep. 2019, 233 Pages. (Abstract Only) Mar. 7, 2022 from Weblink: https://oa.upm.es/56492/.

Goos et al., Phase Diagrams of $CO_2$ and $CO_2-N_2$ Gas Mixtures and Their Application in Compression Processes, Energy Procedia, vol. 4, 2011, pp. 3778-3785.

Javed et al., Thermodynamic Speed of Sound Data for Liquid and Supercritical Alcohols, Journal of Chemical & Engineering Data, vol. 64, No. 3, 2019, pp. 1035-1044.

Legoix et al., Phase Equilibria of the $CH_4-CO_2$ Binary and the $CH_4-CO_2-H_2O$ Ternary Mixtures in the Presence of a $CO_2$-Rich Liquid Phase, 10122034, Energies, vol. 10, 2017, 11 Pages.

Oag et al., Probing the Vapor-Liquid Phase Behaviors of Near-Critical and Supercritical Fluids Using a Shear Mode Piezoelectric Sensor, Analytical Chemistry, vol. 75, No. 3, Feb. 1, 2003, p. 479-485.

Park et al., Measurements of Density and Sound Speed in Mixtures Relevant to Supercritical $CO_2$ Cycles, Journal of Energy Resources Technology, vol. 142, Oct. 2020, 7 Pages.

Wetenhall et al., The Effect of $CO_2$ Purity on the Development of Pipeline Networks for Carbon Capture and Storage Schemes, International Journal of Greenhouse Gas Control, vol. 30, 2014, pp. 197-211.

* cited by examiner

LIQUID FLUID SYSTEMS INCLUDING PHASE DETECTION SENSORS FOR TURBINE ENGINES

FIELD

The present disclosure generally pertains to monitoring and controlling phase properties of pericritical fluids including supercritical fluids and near-supercritical fluids. More particularly, the present disclosure generally pertains to pericritical fluids used in connection with engines, such as turbine engines, including thermal management systems and fuel systems that utilize pericritical fluids.

BACKGROUND

An engine, such as a turbine engine, may utilize pericritical fluids for various purposes. Such pericritical fluids may be utilized while exhibiting a near-supercritical or supercritical phase state. For example, a pericritical fluid may be utilized in a near-supercritical or supercritical state to cool various fluid streams or components of the engine. As another example, an engine may utilize a fuel that has a pericritical state, such as a near-supercritical or a supercritical phase state.

One or more operations of the engine may be impacted by a phase state of such a pericritical fluid. For example, the engine may be configured for the pericritical fluid to be utilized in a pericritical phase state, such as in a near-supercritical phase state and/or in a supercritical phase state. Additionally, or in the alternative, one or more operations of the engine may be impacted by variations in one or more phase properties of the pericritical fluid, such as variations corresponding to a phase change in the pericritical fluid and/or variations that may occur within a respective phase state of the pericritical fluid.

BRIEF DESCRIPTION OF THE DRAWINGS

A Full and Enabling Disclosure, Including the Best Mode Thereof, Directed to One of Ordinary Skill in the Art, is Set Forth in the Specification, which Makes Reference to the Appended Figures, in which.

Figure 1:
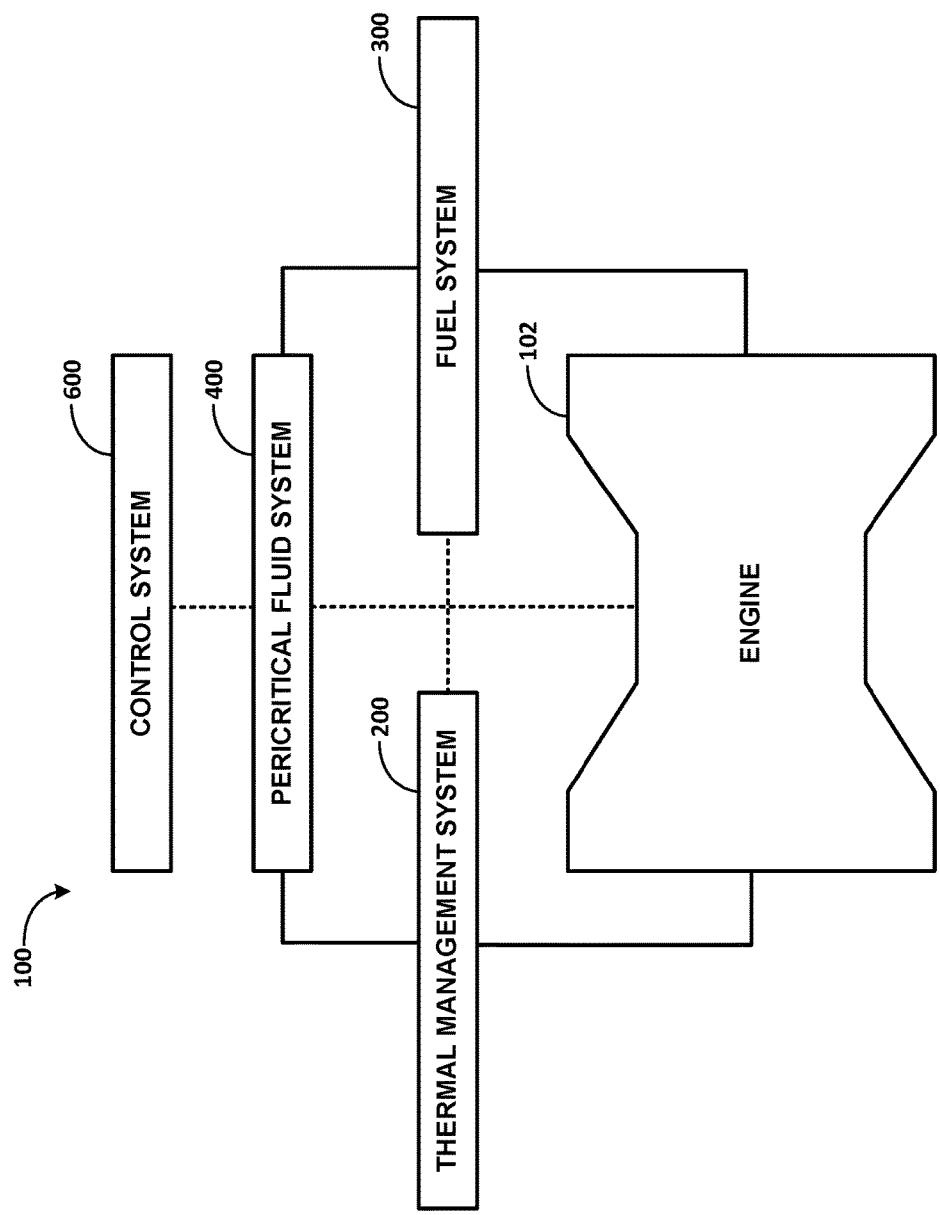
FIG. 1 schematically depicts an exemplary power generation system that includes an engine and a pericritical fluid system.

Repeat use of reference characters in the present specification and drawings is intended to represent the same or analogous features or elements of the present disclosure.

DETAILED DESCRIPTION

Reference now will be made in detail to embodiments of the disclosure, one or more examples of which are illustrated in the drawings. Each example is provided by way of explanation of the disclosure, not limitation of the disclosure. In fact, it will be apparent to those skilled in the art that various modifications and variations can be made in the present disclosure without departing from the scope or spirit of the disclosure. For instance, features illustrated or described as part of one embodiment can be used with another embodiment to yield a still further embodiment. Thus, it is intended that the present disclosure covers such modifications and variations as come within the scope of the appended claims and their equivalents.

The word "exemplary" is used herein to mean "serving as an example, instance, or illustration." Any implementation described herein as "exemplary" is not necessarily to be construed as preferred or advantageous over other implementations. Additionally, unless specifically identified otherwise, all embodiments described herein should be considered exemplary.

As used herein, the terms "first", "second", and "third" may be used interchangeably to distinguish one component from another and are not intended to signify location or importance of the individual components.

The terms "upper", "lower", "right", "left", "vertical", "horizontal", "top", "bottom", "lateral", "longitudinal", and so forth, shall relate to the disclosure as it is oriented in the drawing figures. However, it is to be understood that the disclosure may assume various alternative orientations, except where expressly specified to the contrary. It is also to be understood that the specific devices illustrated in the attached drawings, and described in the following specification, are simply exemplary embodiments of the disclosure. Hence, specific dimensions and other physical characteristics related to the embodiments disclosed herein are not to be considered as limiting.

The terms "forward" and "aft" refer to relative positions within a turbine engine, with forward referring to a position closer to an engine inlet and aft referring to a position closer to an engine nozzle or exhaust.

The terms "upstream" and "downstream" refer to the relative direction with respect to fluid flow in a fluid pathway. For example, "upstream" refers to the direction from which the fluid flows, and "downstream" refers to the direction to which the fluid flows.

The singular forms "a", "an", and "the" include plural references unless the context clearly dictates otherwise.

The terms "coupled," "fixed," "attached to," and the like refer to both direct coupling, fixing, or attaching, as well as indirect coupling, fixing, or attaching through one or more intermediate components or features, unless otherwise specified herein.

Approximating language, as used herein throughout the specification and claims, is applied to modify any quantitative representation that could permissibly vary without resulting in a change in the basic function to which it is related. Accordingly, a value modified by a term or terms, such as "about", "approximately", and "substantially", are not to be limited to the precise value specified. In at least some instances, the approximating language may correspond to the precision of an instrument for measuring the value, or the precision of the methods or machines for constructing or manufacturing the components and/or systems. For example, the approximating language may refer to being within a 1, 2, 4, 10, 15, or 20 percent margin.

Here and throughout the specification and claims, range limitations are combined and interchanged, such ranges are identified and include all the sub-ranges contained therein unless context or language indicates otherwise. For example, all ranges disclosed herein are inclusive of the endpoints, and the endpoints are independently combinable with each other.

The term "at least one of" in the context of, e.g., "at least one of A, B, and C" refers to only A, only B, only C, or any combination of A, B, and C.

Additionally, the terms "low," "high," or their respective comparative degrees (e.g., lower, higher, where applicable) each refer to relative speeds within an engine, unless otherwise specified. For example, a "low-pressure turbine" operates at a pressure generally lower than a "high-pressure turbine." Alternatively, unless otherwise specified, the aforementioned terms may be understood in their superlative degree. For example, a "low-pressure turbine" may refer to the lowest maximum pressure turbine within a turbine section, and a "high-pressure turbine" may refer to the highest maximum pressure turbine within the turbine section.

The term "turbomachine" refers to a machine that includes a combustor section and a turbine section with one or more turbines that together generate a thrust output and/or a torque output. In some embodiments, a turbomachine may include a compressor section with one or more compressors that compress air or gasses flowing to the combustor section.

As used herein, the term "turbine engine" refers to an engine that may include a turbomachine as all or a portion of its power source. Example turbine engines include gas turbine engines, as well as hybrid-electric turbine engines, such as turbofan engines, turboprop engines, turbojet engines, turboshaft engines, and the like.

One or more components of the engines described herein may be manufactured or formed using any suitable process, such as an additive manufacturing process, such as a 3-D printing process. The use of such a process may allow such component to be formed integrally, as a single monolithic component, or as any suitable number of sub-components. In particular, the additive manufacturing process may allow such component to be integrally formed and include a variety of features not possible when using prior manufacturing methods. For example, the additive manufacturing methods described herein may allow for the manufacture of passages, conduits, cavities, openings, casings, manifolds, double-walls, heat exchangers, or other components, or particular positionings and integrations of such components, having unique features, configurations, thicknesses, materials, densities, fluid passageways, headers, and mounting structures that may not have been possible or practical using prior manufacturing methods. Some of these features are described herein.

Suitable additive manufacturing technologies in accordance with the present disclosure include, for example, Selective Laser Melting (SLM), Direct Metal Laser Melting (DMLM), Fused Deposition Modeling (FDM), Selective Laser Sintering (SLS), 3D printing such as by inkjets, laser jets, and binder jets, Stereolithography (SLA), Direct Selective Laser Sintering (DSLS), Electron Beam Sintering (EBS), Electron Beam Melting (EBM), Laser Engineered Net Shaping (LENS), Laser Net Shape Manufacturing (LNSM), Direct Metal Deposition (DMD), Digital Light Processing (DLP), Direct Selective Laser Melting (DSLM), and other known processes.

Suitable powder materials for the manufacture of the structures provided herein as integral, unitary, structures include metallic alloy, polymer, or ceramic powders. Exemplary metallic powder materials are stainless-steel alloys, cobalt-chrome alloys, aluminum alloys, titanium alloys, nickel-based superalloys, and cobalt-based superalloys. In addition, suitable alloys may include those that have been engineered to have good oxidation resistance, known as "superalloys" which have acceptable strength at the elevated temperatures of operation in a turbine engine, e.g. Hastelloy, Inconel alloys (e.g., IN 738, IN 792, IN 939), Rene alloys (e.g., Rene N4, Rene N5, Rene 80, Rene 142, Rene 195), Haynes alloys, Mar M, CM 247, CM 247 LC, C263, 718, X-850, ECY 768, 282, X45, PWA 1483 and CMSX (e.g. CMSX-4) single crystal alloys. The manufactured objects of the present disclosure may be formed with one or more selected crystalline microstructures, such as directionally solidified ("DS") or single-crystal ("SX").

As used herein, the terms "integral", "unitary", or "monolithic" as used to describe a structure refers to the structure being formed integrally of a continuous material or group of materials with no seams, connections joints, or the like. The integral, unitary structures described herein may be formed through additive manufacturing to have the described structure, or alternatively through a casting process, etc.

The present disclosure generally provides systems and methods for monitoring and/or controlling phase properties of pericritical fluids including supercritical fluids and near-supercritical fluids. Such pericritical fluids may be used in connection with engines, such as turbine engines, for example, as a cooling fluid and/or as a fuel. The present disclosure provides pericritical fluid systems that may be utilized to monitor and/or control one or more phase properties of a pericritical fluid, such as a phase state of the pericritical fluid. In some embodiments, a pericritical fluid system may be utilized by, and/or may be included as part of, a thermal management system associated with an engine. The thermal management system may utilize a pericritical fluid, for example, to cool one or more fluid streams associated with and engine and/or to cool one or more components on the engine. Additionally, or in the alternative, in some embodiments, a pericritical fluid system may be utilized by, and/or may be included as part of, a fuel system associated with an engine. The fuel system may utilize a pericritical fluid as a fuel source for the engine. The pericritical fluid system may include one or more sensors configured to generate sensor outputs that may be utilized by a control system to perform control operations, such as control operations associated with the pericritical fluid system. The sensor outputs may be utilized to monitor one or more phase properties of the pericritical fluid. The control system may provide control commands to one or more controllable components, for example, to control the one or more phase properties of the pericritical fluid.

In accordance with the present disclosure, the one or more sensors utilized by the pericritical fluid system may include a phase detection sensor configured to generate sensor outputs that may be correlated to one or more phase properties of the pericritical fluid, such as a phase state of the pericritical fluid. In some embodiments, the sensor outputs from a phase detection sensor may be utilized to determine one or more phase properties of the fluid. Additionally, or in the alternative, the sensor outputs from a phase detection sensor may be utilized in combination with further sensor outputs from one or more temperature sensors and/or pressure sensors. For example, the sensor outputs from the phase detection sensor may indicate a change in one or more phase properties of the pericritical fluid, and the sensor outputs from the one or more temperature sensors and/or pressure sensors may be utilized to associate the change in the one or more phase properties of the pericritical fluid with a phase state of the pericritical fluid. Stated differently, in some embodiments, the sensor outputs from the phase detection sensor may be utilized to indicate that some change in one or more phase properties of the pericritical fluid has occurred, and the sensor outputs from the one or more temperature sensors and/or pressure sensors may be utilized to associate the change with a particular phase state of the pericritical fluid. Additionally, or in the alternative, in some embodiments, one or more sensor outputs from a phase detection sensor may be utilized to determine one or more phase properties of a pericritical fluid, such as a phase state of the pericritical fluid, for example, without reference to other sensor outputs such as from a temperature sensor and/or pressure sensor.

As used herein, the term "pericritical fluid" refers to a fluid that has a supercritical phase state or a near-supercritical phase state. The term "pericritical fluid" is inclusive of a fluid that constitutes a supercritical fluid or a near-supercritical fluid. A fluid may be referred to as having a pericritical phase state when the fluid has a temperature and a pressure corresponding to the pericritical phase of the fluid.

As used herein, the term "supercritical fluid" refers to a fluid that has a temperature and pressure that exceed those of the critical point of the fluid. A fluid may be referred to as having a supercritical phase state when the fluid has a temperature that exceeds the critical temperature of the fluid and a pressure that exceed the critical pressure of the fluid.

As used herein, the term "near-supercritical fluid" refers to a fluid other than a supercritical fluid that has a temperature that is at least 70% of the critical temperature of the fluid, as calculated based on absolute temperature, and a pressure that is at least 70% of the critical pressure of the fluid, as calculated based on absolute pressure. A near-supercritical fluid may have a temperature that is above the critical temperature of the fluid and a pressure that is below the critical pressure of the fluid, or a near-supercritical fluid may have a pressure that is above the critical pressure of the fluid and a temperature that is below the critical temperature of the fluid. A fluid may be referred to as having a near-supercritical phase state when the fluid has a temperature and a pressure corresponding to the near-supercritical phase of the fluid. A near-supercritical fluid may have a liquid phase state or a gas phase state.

As used herein, the term "critical temperature" refers to the temperature above which a gas cannot be liquified by pressure alone. As used herein, the term "critical pressure" refers to the pressure required to liquify a gas at its critical temperature. The term "critical point," as used herein in relation to a fluid, refers to a point defined by the critical temperature and critical pressure of a fluid.

As used herein, the term "phase property" refers to and includes a phase state of a fluid, or a physical property of a fluid that depends on the phase state of the fluid. A phase property of a fluid may differ as between different phases, for example, as between at least two of: a liquid phase, a gas phase, a near-supercritical phase, and a supercritical phase. Additionally, or in the alternative, a phase property of a fluid may differ as between different phase states, including as between different phase states within a given phase. By way of example, physical properties of a fluid that depend on the phase state of the fluid, and are encompassed by the term "phase property," include: density, heat capacity, refractive index, thermal conductivity, viscosity, and coefficient of thermal expansion.

As used herein, the term "phase state" refers to a condition of a fluid with respect to a phase of the fluid and/or with respect to a region within a phase of the fluid. By way of example, phase state of a fluid may include and refer to a condition of a fluid with respect to a pericritical phase or a region within the pericritical phase, a supercritical phase or a region within the supercritical phase, a near-supercritical phase or a region within the near-supercritical phase, a gas phase or a region within the gas phase, or a liquid phase or a region within the liquid phase.

In some embodiments, a fluid may include a single component. In some embodiments, a fluid may include at least two components. A fluid that has two components may sometimes be referred to as a bimodal fluid. Such combination of two fluid components may sometimes be referred to as a bimodal combination. A fluid that has at least two components may sometimes be referred to as a multimodal fluid. The term multimodal fluid includes bimodal fluids. A combination of at least two fluid components may sometimes be referred to as a multimodal combination.

As used herein, the term "multiphasic state" refers to a fluid that includes a plurality of components that have respectively different phase states. As used herein, the term "multiphasic region" refers to a region of a phase diagram for a multimodal fluid within which the fluid has a multiphasic state. For example, a fluid that has a multiphasic state may include a first fluid-component and a second fluid-component, and the first fluid-component and the second fluid-component may respectively have: a liquid phase state and a gas phase state, a liquid phase state and a pericritical phase state, a gas phase state and a pericritical phase state, a liquid phase state and a supercritical phase state, a liquid phase state and a near-supercritical phase state, a gas phase state and a supercritical phase state, a gas phase state and a near-supercritical phase state, or a supercritical phase state and a near-supercritical phase state.

As examples, suitable fluids that may be utilized in accordance with the present disclosure include carbon monoxide, carbon dioxide, ammonia, methane, methanol, ethanol, ethylene, propane, propylene, heptane, 1-octanol, 2-octanol, 2-propanol, difluoromethane, ethane, difluoroethane, tetrafluoroethene, acetone, nitrous oxide, argon, bromine, neon, hydrogen, oxygen, or water, as well as combinations of these. In some embodiments, a bimodal or multimodal fluid may include one or more of the aforementioned exemplary fluids, such as at least two of the aforementioned exemplary fluids. By way of example, a bimodal or multimodal fluid may include at least one of: carbon dioxide and nitrogen; carbon dioxide and hydrogen; carbon dioxide and oxygen; carbon dioxide and methane; carbon dioxide and heptane; carbon dioxide and 1-octanol; carbon dioxide and 2-octonal; carbon dioxide, nitrogen, and ethane; carbon dioxide, hydrogen, and ethane; and carbon dioxide, 2-propanol, and nitrogen.

By way of example, some critical points of some exemplary fluids are as follows: carbon monoxide: about 133.2 K and about 3.5 MPa; carbon dioxide: about 304.2 K and about 7.4 MPa; ammonia: about 405.5 K and about 11.3 MPa; methane: about 190.6 K and about 4.6 MPa; methanol: about 512.6 K and about 8.1 MPa; ethanol: about 516.3 K and about 6.4 MPa; ethylene: about 282.4 K and about 5.1 MPa;

propane: about 369.9 K and about 4.3 MPa; propylene: about 365.6 K and about 4.7 MPa; heptane: about 540.6 K and about 2.7 MPa; 1-octanol: about 655.1 K and about 2.7 MPa; 2-octanol: about 632.7 K and about 2.8 MPa; 2-propanol: about 508.8 K and 5.4 MPa; difluoromethane: about 304.1 K and about 7.38 MPa; ethane: about 3.5.5 K and about 4.9 mPa; difluoroethane: about 351 K and about 5.8 MPa; tetrafluoroethene: about 306.5 K and about 3.8 MPa; acetone: about 508 K and about 4.8 MPa; nitrous oxide: about 309.6 K and about 7.3 MPa; argon: about 150.7 K and about 4.9 MPa; bromine: about 588 K and about 10.3 MPa; neon: about 44.4 K and about 2.8 MPa; hydrogen: about 33.2 K and about 1.3 MPa; oxygen: about 154.6 K and about 5.1 MPa; and water: about 647.1 K and about 22.1 MPa.

Exemplary embodiments of the present disclosure will now be described in further detail. Referring to FIG. 1, an exemplary power generation system 100 is shown. An exemplary power generation system 100 may include an engine 102, such as a turbine engine. The engine 102 may be mounted to an aircraft, such as a fixed-wing or rotary-wing aircraft. The power generation system 100 may be configured to provide propulsion and/or thrust to power the aircraft, such as during flight and/or during on-ground maneuvers. The engine 102 may be mounted to an aircraft, such as in an under-wing configuration or in a tail-mounted configuration. In other embodiments, the engine 102 may be configured as a rocket engine, a ramjet engine, a turbo-rocket engine that includes a combination of a turbomachine and a rocket engine, a turbo-ramjet that includes a combination of a turbomachine and a ramjet engine, or a rocket-ramjet that includes a combination of a rocket engine and a ramjet engine.

As shown in FIG. 1, in some embodiments, a power generation system 100 and/or an engine 102 may include a thermal management system 200. A thermal management system 200 may be configured to transfer heat from one or more heat sources associated with the engine 102 and/or power generation system 100. The thermal management system 200 may be configured to circulate a cooling fluid through a cooling circuit, and heat from the one or more heat sources may be transferred to the cooling fluid. In some embodiments, when circulated through the cooling circuit, the cooling fluid may have a pericritical phase state, such as a supercritical phase state and/or a near-supercritical phase state. As further shown in FIG. 1, in some embodiments, a power generation system 100 and/or an engine 102 may include a fuel system 300. A fuel system 300 may be configured to supply fuel to the engine 102. In some embodiments, the fuel may be a cryogenic fuel. In accordance with the present disclosure, a power generation system 100 and/or an engine 102 may include a pericritical fluid system 400, as shown in FIG. 1. In some embodiments, a pericritical fluid system 400 may be utilized in connection with a thermal management system 200. Additionally, or in the alternative, a pericritical fluid system 400 may be utilized in connection with a fuel system 300.

The presently disclosed subject matter may be implemented in any desired setting that includes a power generation system 100 and/or an engine, such as land vehicles, marine vessels, power generation facilities, manufacturing facilities, industrial machinery, and the like. In the context of an aircraft, the presently disclosed subject matter may be implemented in any desired fixed or rotary wing aircraft, including commercial, military, or civilian aircraft, as well as unmanned aircraft such as unmanned aerial vehicles, drones, and the like. The presently disclosed subject matter may be useful in numerous other settings, and it is intended that the presently disclosed subject matter may be implemented in any setting without departing from the intended scope of the present disclosure.

Referring now to FIGS. 2A-2E, exemplary thermal management systems 200 are further described. As shown in FIGS. 2A-2E, an exemplary thermal management system 200 may include one or more heat exchangers 202 respectively configured to cool a fluid stream 204 associated with the engine 102 and/or the power generation system 100. The fluid stream 204 flowing through a respective heat exchanger 202 may be cooled by a cooling fluid 206 flowing through a cooling circuit 208. The cooling fluid 206 may be a pericritical fluid, such as a supercritical fluid or a near-supercritical fluid. The cooling circuit 208 may include one or more cooling conduits 210. The one or more cooling conduits 210 may be configured to supply the cooling fluid 206 to the one or more heat exchangers 202, for example with the cooling fluid 206 having a pericritical phase state, such as a supercritical phase state and/or a near-supercritical phase state. The one or more cooling conduits 210 may be defined at least in part by a structure of the one or more heat exchangers 202, such as a monolithic structure of the one or more heat exchangers 202. The cooling circuit 208 may include one or more cooling conduits 210 and may be configured to receive cooling fluid 206 discharging from the one or more heat exchangers 202.

During operation, the cooling fluid 206 may be supplied to the one or more heat exchangers 202 and/or circulated through the cooling circuit 208 in a pericritical phase state. Additionally, or in the alternative, the cooling fluid 206 may have a pericritical phase state when the cooling fluid 206 flows through the one or more heat exchangers 202 and/or circulates through the cooling circuit 208. The cooling circuit 208 may include a pump 212 configured to circulate the cooling fluid 206 through the cooling circuit 208. In some embodiments, the thermal management system 200 and/or the cooling circuit 208 may include a refrigeration system 214 configured to bring the cooling fluid 206 to a pericritical phase state and/or maintain the cooling fluid 206 at a pericritical phase state, such as a supercritical phase state and/or a near-supercritical phase state. The refrigeration system 214 may include components configured to perform any suitable refrigeration cycle, such as evaporative cooling, absorption refrigeration, thermoelectric refrigeration, or mechanical-compression refrigeration, cryogenic refrigeration, as well as combinations of these. Additionally, or in the alternative, the refrigeration system 214, such as a refrigeration system 214 configured to perform cryogenic refrigeration, may include a cryocooler, such as a Stirling-type cooler, a Gifford-McMahon cooler, a pulse-tube refrigerator, or a Joule-Thomson cooler, as well as combinations of these. Additionally, or in the alternative, the cooling circuit 208 may include any other suitable source of cooling fluid 206, such as a tank or vessel configured to supply cooling fluid 206 to the cooling circuit 208, for example, with the cooling fluid 206 having a pericritical phase state. The cooling circuit 208 may include one or more cooling fluid-control valves 224 configured to control a flow of cooling fluid 206 flowing through the cooling circuit 208. Additionally, or in the alternative, the thermal management system 200 may include one or more fluid stream-control valves 226 configured to control a flow of a fluid stream 204 flowing through a respective heat exchanger 202.

Figure 2A:
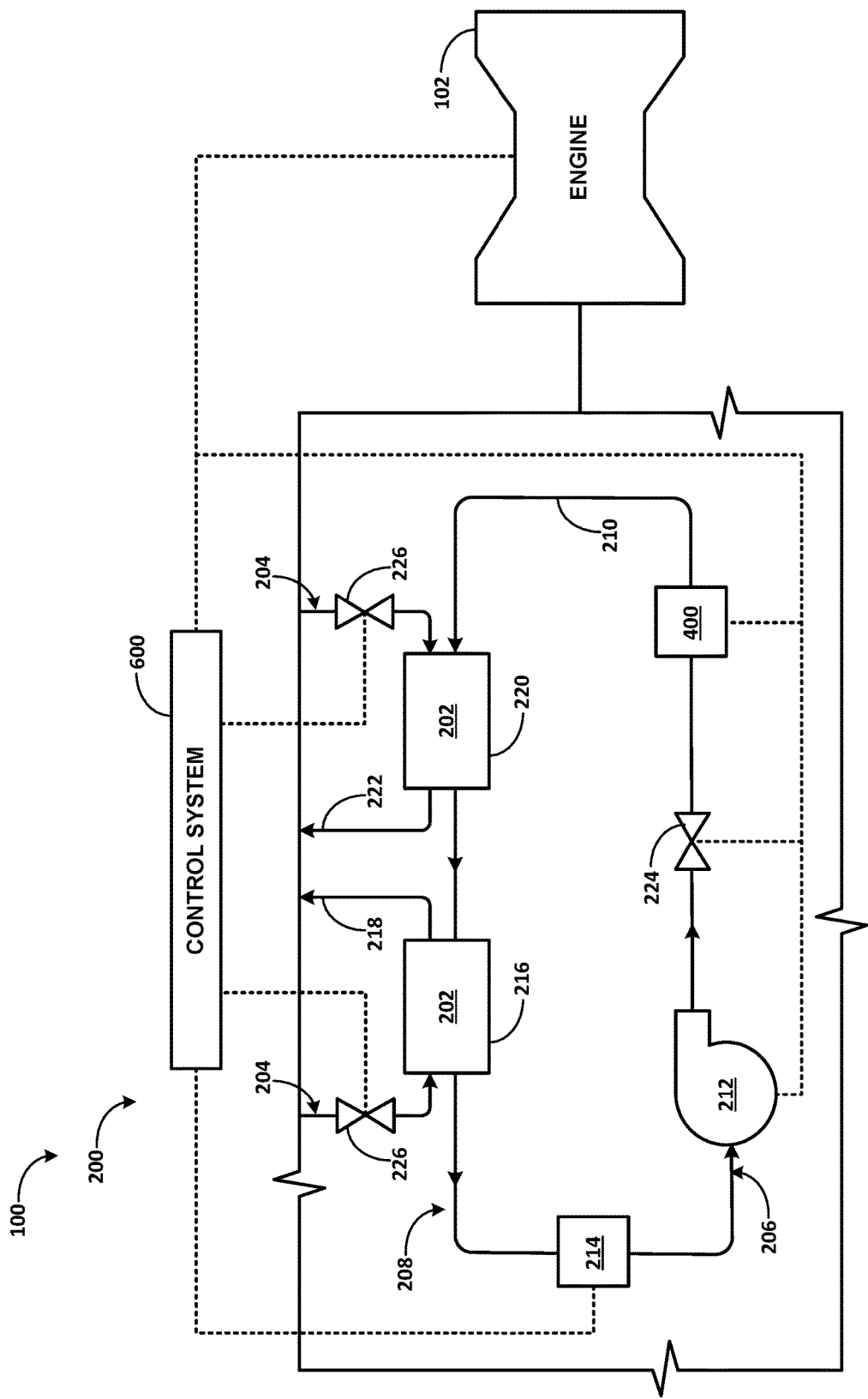
FIGS. 2A-2E respectively schematically depict an exemplary thermal management systems that may utilize or include a pericritical fluid system, such as in connection with the power generation system and/or engine of FIG. 1.

As shown, for example, in FIG. 2A, in some embodiments, the thermal management system 200 may include a plurality of heat exchangers 202. By way of example, the thermal management system 200 may include a first heat exchanger 216 configured to cool a first fluid stream 204 flowing through a first fluid conduit 218. The first fluid conduit 218 may be defined at least in part by a structure of the first heat exchanger 216, such as a monolithic structure of the first heat exchanger 216. The first fluid conduit 218 may include one or more fluid supply lines in fluid communication with the first heat exchanger 216 and configured to supply the first fluid 204 to the first heat exchanger 216 and/or to receive the first fluid 204 flowing out of the first heat exchanger 216. Additionally, or in the alternative, the thermal management system 200 may include a second heat exchanger 220 configured to cool a second fluid stream 204 flowing through a second fluid conduit 222. The second fluid conduit 222 may be defined at least in part by a structure of the second heat exchanger 220, such as a monolithic structure of the second heat exchanger 220. The second fluid conduit 222 may include one or more fluid supply lines in fluid communication with the second heat exchanger 220 and configured to supply the second fluid 204 to the second heat exchanger 220 and/or to receive the second fluid 204 flowing out of the second heat exchanger 220.

In some embodiments, as shown, for example, in FIG. 2A, the cooling circuit 208 may be configured as a thermal transport bus that includes a plurality of heat exchangers 202, such as a first heat exchanger 216 and a second heat exchanger 220, respectively configured to transfer heat from a fluid stream 204 to the cooling fluid 206. By way of example, a respective one of the plurality of heat exchangers 202 may include a fuel system heat exchanger, a lubrication system heat exchanger, a sump heat exchanger, a bleed air heat exchanger, a compressor cooling air heat exchanger, thermal clearance control heat exchanger, an engine casing heat exchanger, an environmental control system heat exchanger, or an auxiliary systems heat exchanger. Additionally, or in the alternative, a thermal management system 200 may include any other heat exchanger utilized in connection with a power generation system 100, an engine 102, and/or a vehicle powered by the engine 102.

Figure 2B:
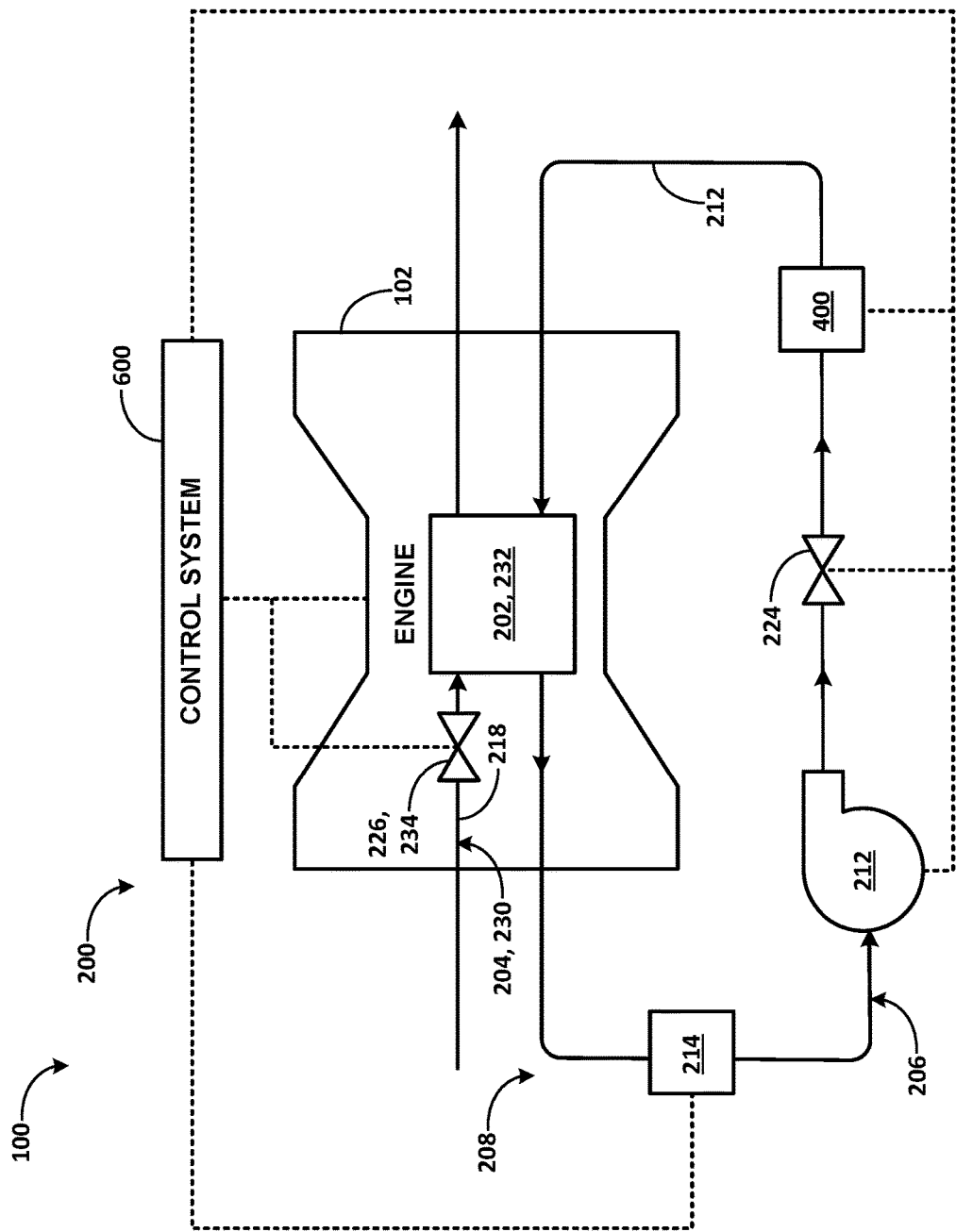
Figure 2C:
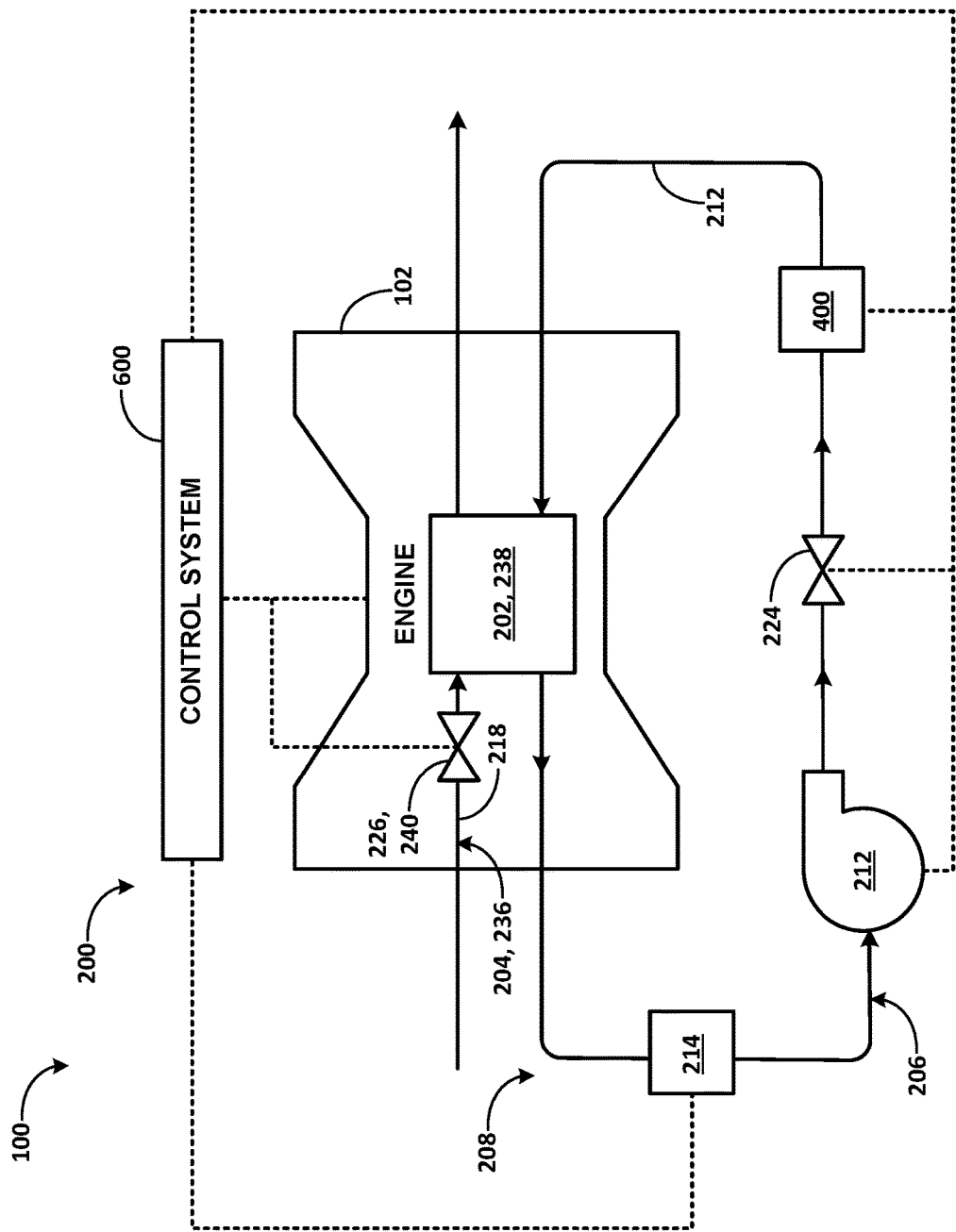

As shown, for example, in FIG. 2B, in some embodiments, the fluid stream 204 cooled by the one or more heat exchangers 202 may include a working fluid utilized by the engine 102 and/or by the power generation system 100. In some embodiments, the engine 102 may be configured as a turbine engine, and the fluid stream 204 may include intake air 230 flowing into a compressor section of the turbine engine. The one or more heat exchangers 202 may include a precooler 232 configured to precool the intake air 230 supplied to the compressor section of the turbine engine. As shown, a fluid stream-control valve 226, such as a variable geometry inlet duct 234, may be configured to control the flow of intake air 230 flowing through the precooler 232. Additionally, or in the alternative, as shown, for example, in FIG. 2C, in some embodiments, the engine 102 may be configured as a turbine engine, and the fluid stream 204 may include compressor bleed air 236 from a compressor section of the turbine engine. The compressor bleed air 236 may be utilized to cool components of the turbine engine, such as blades, hubs, and/or casings of a turbine section of the turbine engine. The compressor bleed air 236 may additionally or alternatively be utilized by one or more auxiliary systems associated with the engine 102 and/or the power generation system 100. For example, the fluid stream 204 may be utilized by an environmental control system configured, for example, to provide pressurization and/or temperature control to a cabin or other areas of an aircraft. The one or more heat exchangers 202 may include a bleed air-heat exchanger 238 configured to cool the compressor bleed air 236 prior to being utilized to cool such components of the turbine engine and/or prior to being utilized by such environmental control system. As shown, a fluid stream-control valve 226, such as a bleed air-control valve 240, may be configured to control the flow of compressor bleed air 236 flowing through the bleed air-heat exchanger 238.

Figure 2D:
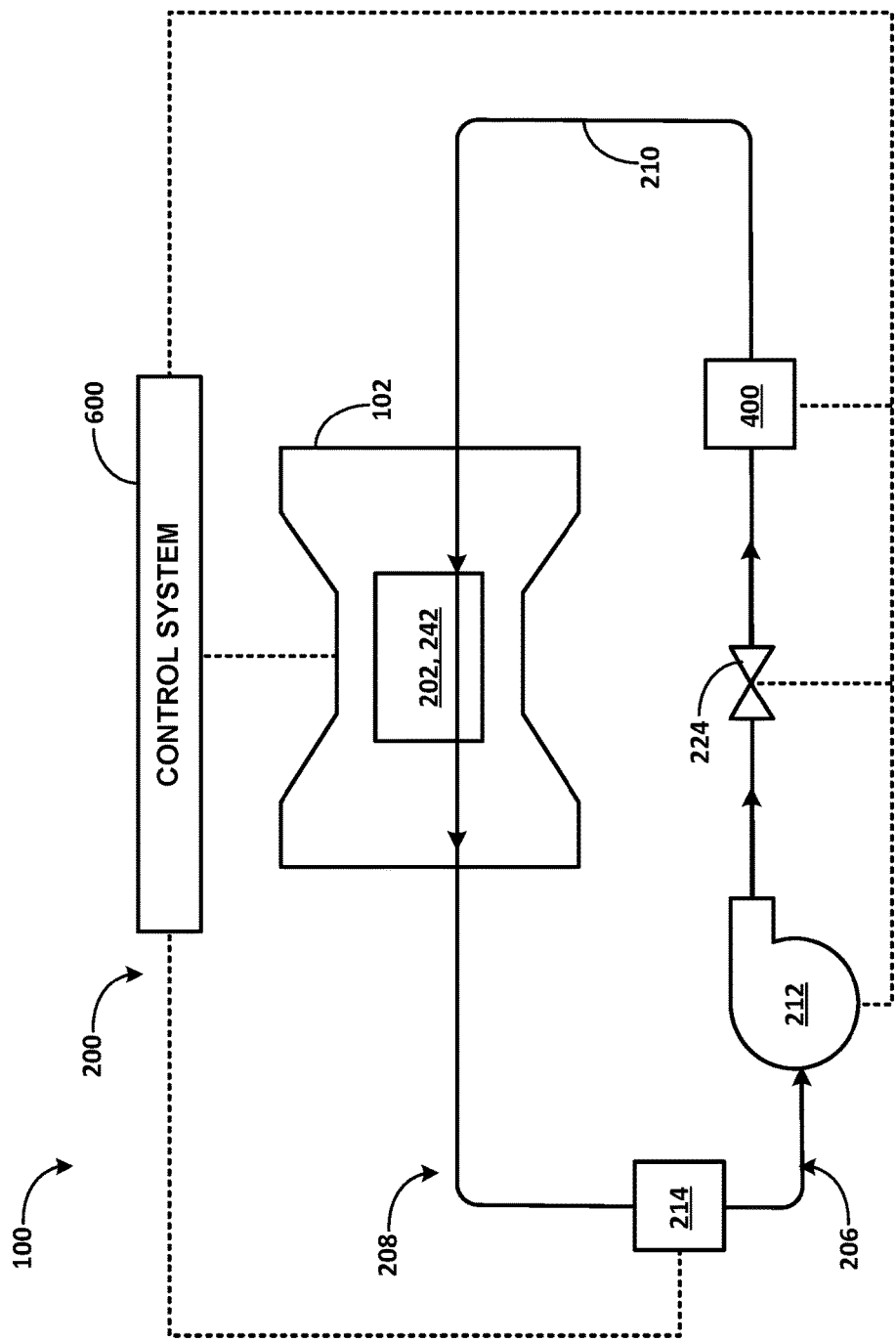
Figure 2E:
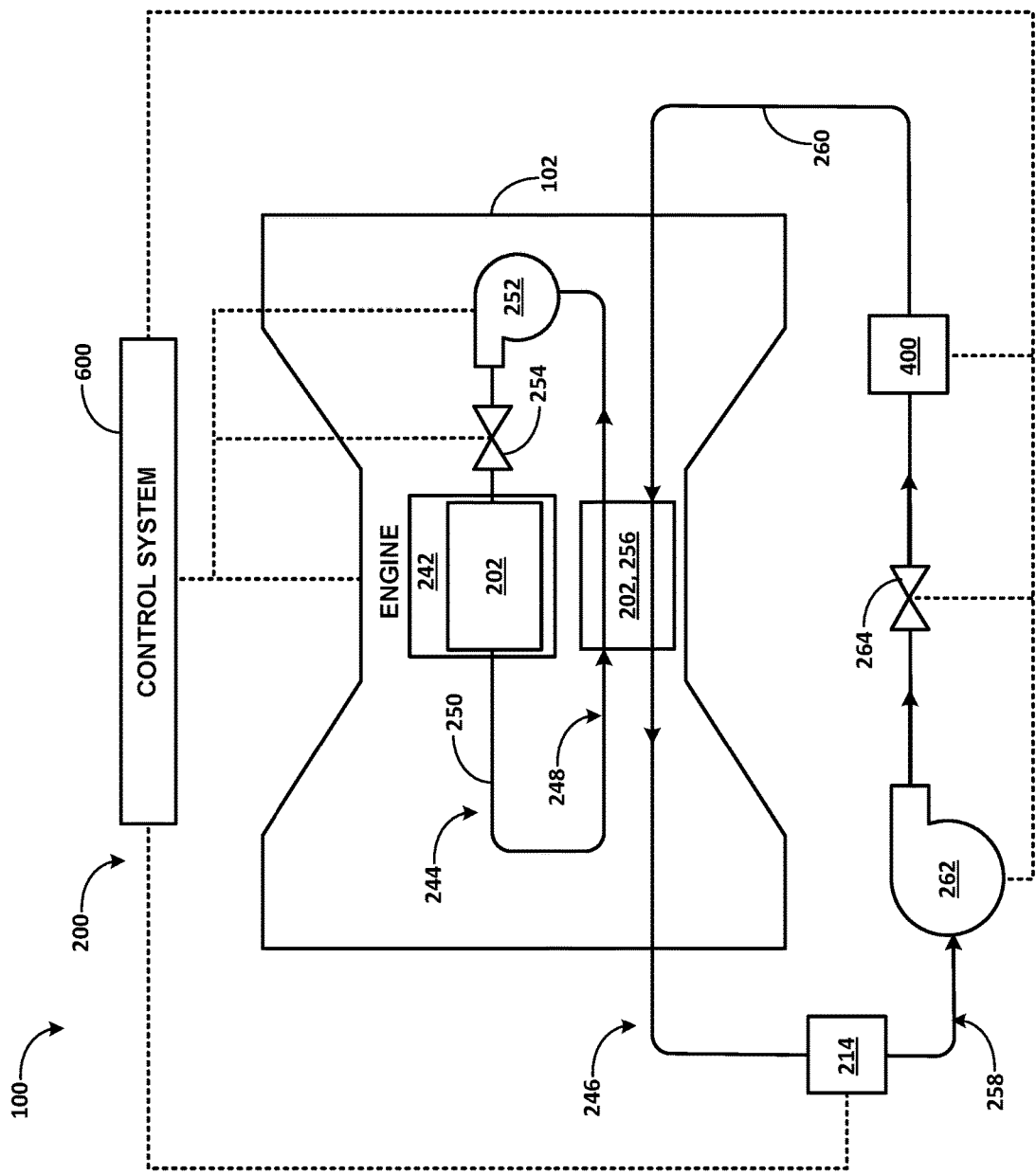

As shown, for example, in FIGS. 2D and 2E, in some embodiments, the cooling fluid 206 may be utilized to cool one or more components 242 of the engine 102. In some embodiments, as shown in FIG. 2D, the one or more components 242 of the engine 102 may define at least a portion of the one or more cooling conduits 210 of the cooling circuit 208. For example, the cooling fluid 206 may flow through one or more cooling conduits 210 defined by a structure of the one or more components 242 of the engine 102, such as a monolithic structure of the one or more components of the engine 102. Additionally, or in the alternative, the one or more components 242 of the engine 102 cooled by the cooling fluid 206 may define a heat exchanger 202 through which the cooling fluid 206 may flow. For example, the heat exchanger 202 may be defined by a structure of the one or more components 242 of the engine 102, such as a monolithic structure of the one or more components of the engine 102.

In some embodiments, the one or more components 242 of the engine cooled by the cooling fluid 206 may include an engine case. For example, in some embodiments, the engine 102 may be configured as a hybrid electric turbine engine, and the one or more components 242 cooled by the cooling fluid 206 may include one or more components of an electric motor, such as a rotor, a stator, and/or a casing of the electric motor. As another example, the engine 102 may be configured as a turbine engine, and the one or more components 242 cooled by the cooling fluid 206 may include a plurality of turbine blades, plurality of stator blades, a plurality of turbine hubs, and/or one or more casing elements that encase a turbine section of the turbine engine.

In some embodiments, as shown in FIG. 2E, the thermal management system 200 may include a primary cooling circuit 244 and an intermediate cooling circuit 246. The primary cooling circuit 244 may be configured to cool one or more components 242 of the engine 102 by heat transfer to a primary cooling fluid 248 flowing through the primary cooling circuit 244. By way of example, the primary cooling fluid 248 may include oil, a liquid hydrocarbon-based material, a dielectric fluid, a liquid metal, or any other fluid that may be suitable for use as a primary cooling fluid 248.

The one or more components 242 of the engine 102 may define one or more heat exchangers 202 through which the primary cooling fluid 248 may flow. For example, the heat exchanger 202 may be defined by a structure of the one or more components 242 of the engine 102, such as a monolithic structure of the one or more components of the engine 102. Additionally, or in the alternative, the primary cooling circuit 244 may include one or more primary cooling conduits 250. The one or more primary cooling conduits 250 may be configured to supply the primary cooling fluid 248 to the one or more heat exchangers 202. The one or more primary cooling conduits 250 may be defined at least in part by a structure of the one or more heat exchangers 202, such as a monolithic structure of the one or more heat exchangers 202. The one or more primary cooling conduits 250 may be configured to receive primary cooling fluid 248 discharging from the one or more heat exchangers 202. In some embodiments, the primary cooling circuit 244 may include a primary pump 252 configured to circulate the primary cooling fluid 248 through the primary cooling circuit 244. Additionally, or in the alternative, the primary cooling circuit 244 may include one or more primary cooling fluid-control valves 254 configured to control a flow of the primary cooling fluid 248 flowing through the primary cooling circuit 244.

The primary cooling circuit 244 and/or the intermediate cooling circuit 246 may include an intermediate heat exchanger 256 configured to transfer heat from the primary cooling fluid 248 flowing through the primary cooling circuit 244 to an intermediate cooling fluid 258 flowing through the intermediate cooling circuit 246. During operation, the intermediate cooling fluid 258 may be supplied to the intermediate heat exchanger 256 and/or circulated through the intermediate cooling circuit 246 in a pericritical phase state, such as a supercritical phase state and/or a near-supercritical phase state. Additionally, or in the alternative, the intermediate cooling fluid 258 may have a pericritical phase state when the intermediate cooling fluid 258 flows through the intermediate heat exchanger 256 and/or circulates through the intermediate cooling circuit 246.

The intermediate cooling circuit 246 may include one or more intermediate cooling conduits 260. The one or more intermediate cooling conduits 260 may be configured to supply the intermediate cooling fluid 258 to the intermediate heat exchanger 256. The one or more intermediate cooling conduits 260 may be defined at least in part by a structure of the intermediate heat exchanger 256, such as a monolithic structure of the intermediate heat exchanger 256. The one or more intermediate cooling conduits 260 may be configured to receive intermediate cooling fluid 258 discharging from the one or more heat exchangers 202.

In some embodiments, the intermediate cooling circuit 246 may include an intermediate cooling-pump 262 configured to circulate the intermediate cooling fluid 258 through the intermediate cooling circuit 246. In some embodiments, the thermal management system 200 and/or the intermediate cooling circuit 246 may include a refrigeration system 214 configured to bring the intermediate cooling fluid 258 to a pericritical phase state, such as a supercritical phase state and/or a near-supercritical phase state. Additionally, or in the alternative, the intermediate cooling circuit 246 may include any other suitable source of intermediate cooling fluid 258, such as a tank or vessel configured to supply intermediate cooling fluid 258 to the intermediate cooling circuit 246, for example, with the intermediate cooling fluid 258 having a pericritical phase state. The intermediate cooling circuit 246 may include one or more intermediate cooling fluid-control valves 264 configured to control a flow of intermediate cooling fluid 258 flowing through the intermediate cooling circuit 246.

Still referring to FIGS. 2A-2E, as shown, the cooling circuit 208 or the intermediate cooling circuit 246 may include a pericritical fluid system 400. In some embodiments, the pericritical fluid system 400 may define a portion of the thermal management system 200. The pericritical fluid system 400 may be configured to determine one or more phase properties of the cooling fluid 206 and/or the intermediate cooling fluid 258. The one or more phase properties of the cooling fluid 206 and/or the intermediate cooling fluid 258 may include a phase state, a transition to or from one phase state to another, and/or one or more physical properties that depend on such a phase state.

Figure 3A:
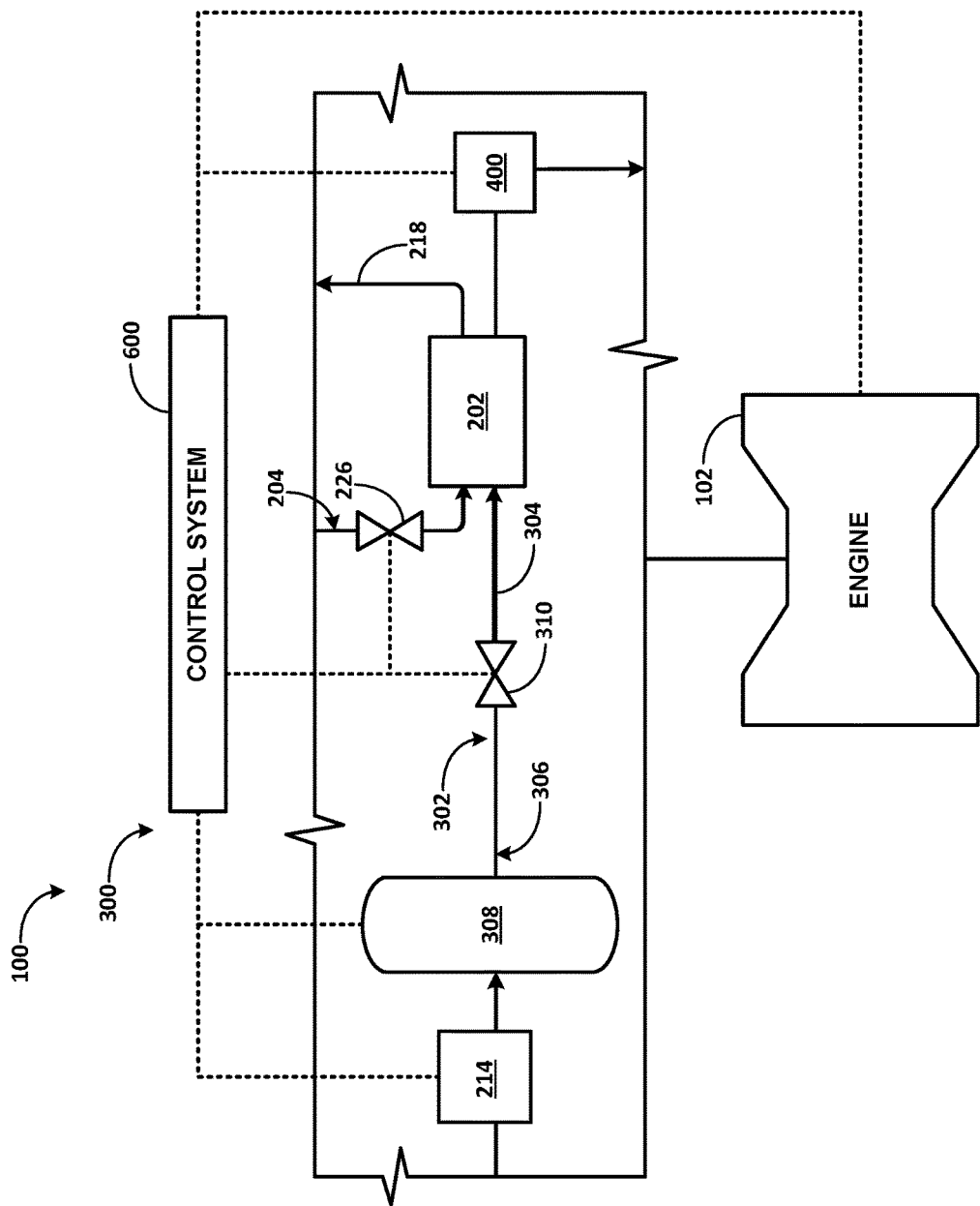
FIGS. 3A and 3B respectively schematically depict an exemplary fuel system that may utilize or include a pericritical fluid system, such as in connection with the power generation system and/or engine of FIG. 1.
Figure 3B:
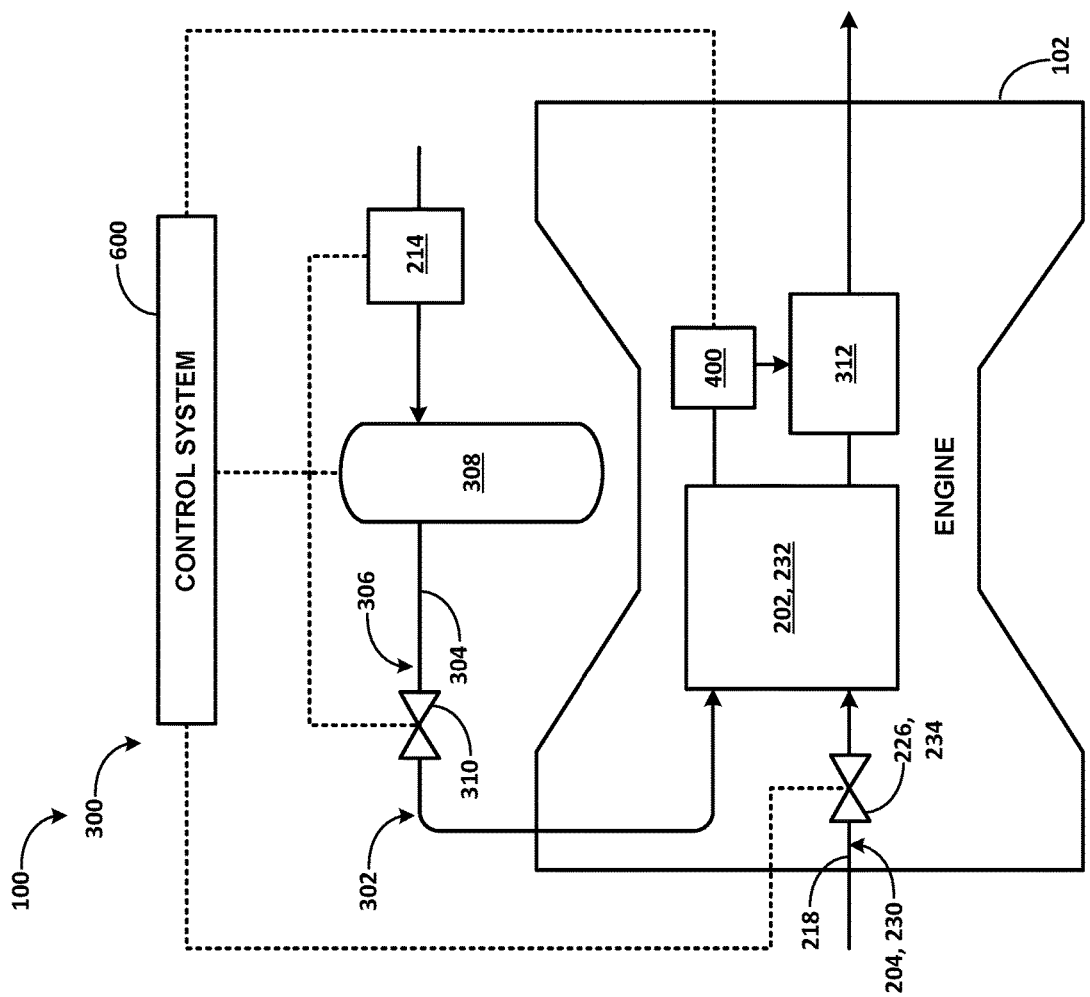

Referring now to FIGS. 3A and 3B, exemplary fuel systems 300 are further described. As shown in FIGS. 3A and 3B, an exemplary fuel systems 300 may include a fuel pathway 302. The fuel pathway 302 may include one or more fuel conduits 304. The fuel conduits 304 may be configured to supply a fuel 306 to the engine 102, for example with the fuel 306 having a pericritical phase state, such as a supercritical phase state and/or a near-supercritical phase state. For example, the fuel 306 may be supplied to the engine 102 in a pericritical phase state. Additionally, or in the alternative, the fuel pathway 302 may include a cooling circuit 208 (FIGS. 2A-2E) through which the fuel 306 may be circulated. By way of example, an exemplary fuel 306 may include hydrogen, methane, liquid natural gas, kerosene, kerosene-type jet fuel (e.g., Jet A, Jet A-1, JP-5, JP-8), as well as combinations of these. In some embodiments, the thermal management system 200 may define at least a portion of a fuel system 300. Additionally, or in the alternative, a fuel system 300 may include a thermal management system 200. In some embodiments, a cooling fluid 206 utilized by a thermal management system 200 may include a fuel 306. Additionally, or in the alternative, in some embodiments, a power generation system 100 and/or an engine 102 may separately include a thermal management system 200 and a fuel system 300.

As shown in FIGS. 3A and 3B, in some embodiments, the fuel system 300 may include a fuel tank 308 configured to store the fuel 306 in a pericritical phase state, such as in a supercritical phase state and/or a near-supercritical phase state. Additionally, or in the alternative, the fuel system 300 may include a pump 212 (FIGS. 2A-2E) configured to supply fuel 306 to the fuel pathway 302 in such a pericritical phase state. The fuel pathway 302 may include one or more fuel-control valves 310 configured to control a flow of fuel 306 flowing through the fuel pathway 302.

As shown, for example, in FIG. 3A, in some embodiments, the fuel system 300 may include one or more heat exchangers 202 respectively configured to cool a fluid stream 204 associated with the engine 102 and/or the power generation system 100. The fluid stream 204 flowing through a respective heat exchanger 202 may be cooled by the fuel 306 flowing through the fuel pathway 302. The fuel pathway 302 may include one or more fuel conduits 304 configured to supply the fuel 306 to the one or more heat exchangers 202, for example with the fuel 306 having a pericritical phase state. The one or more fuel conduits 304 may be defined at least in part by a structure of the one or more heat exchangers 202, such as a monolithic structure of the one or more heat exchangers 202. Additionally, or in the alternative, the fuel pathway 302 may include one or fuel conduits 304 may be configured to receive fuel 306 discharging from the one or more heat exchangers 202. In some embodiments, the fuel system 300 may include one or more fluid stream-control valves 226 configured to control a flow of a fluid stream 204 flowing through a respective heat exchanger 202.

In some embodiments, as shown, for example, in FIG. 3B, the fluid stream 204 cooled by the one or more heat exchangers 202 may include a working fluid utilized by the engine 102 and/or by the power generation system 100. In some embodiments, the engine 102 may be configured as a turbine engine, and the fluid stream 204 may include intake air 230 flowing into a compressor section of the turbine engine. The one or more heat exchangers 202 may include a precooler 232 configured to utilize the fuel 306 to precool the intake air 230 supplied to the compressor section of the turbine engine. As shown, a fluid stream-control valve 226, such as a variable geometry inlet duct 234, may be configured to control the flow of intake air 230 flowing through the precooler 232. Fuel exiting the precooler 232 may flow to a combustion section 312 of the engine 102. At the combustion section 312, the fuel 306 may be combined with intake air 230, and the resulting combination may be combusted, generating thrust.

Still referring to FIGS. 3A and 3B, as shown, the fuel system 300 may include a pericritical fluid system 400. In some embodiments, the pericritical fluid system 400 may define a portion of the fuel system 300. The pericritical fluid system 400 may be configured to determine one or more phase properties of the fuel 306. The one or more phase properties of the fuel 306 may include a phase state, a transition to or from one phase state to another, and/or one or more physical properties that depend on such a phase state.

Figure 4:
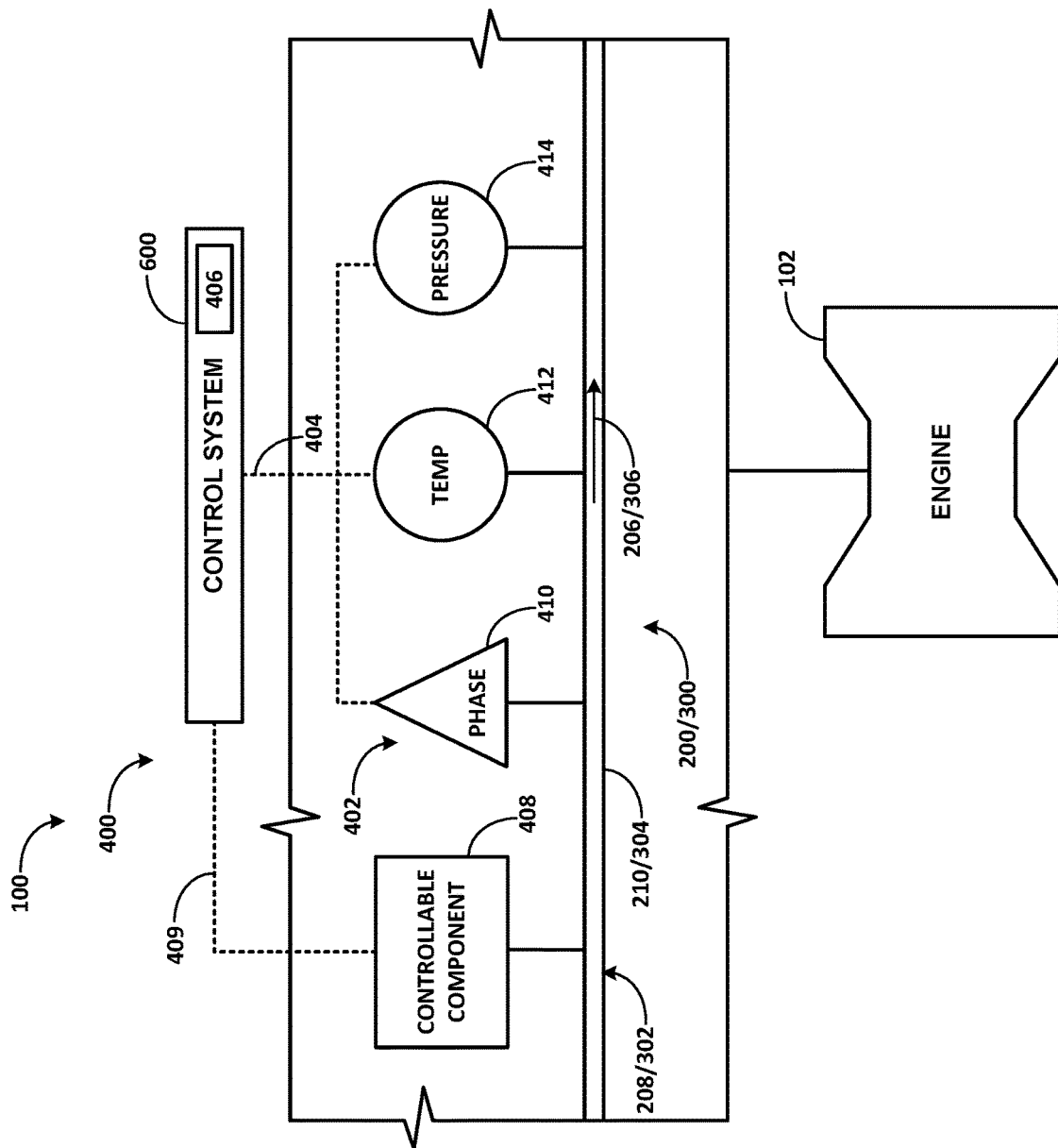
FIG. 4 schematically depicts an exemplary pericritical fluid system that may be utilized by or included in the exemplary thermal management systems of FIGS. 2A-2E and/or that may be utilized or included in the exemplary fuel systems of FIGS. 3A and 3B.

Referring now to FIG. 4, exemplary pericritical fluid systems 400 are further described. An exemplary pericritical fluid system 400 may be included in and/or utilized by a thermal management system 200 and/or a fuel system 300. In some embodiments, a first pericritical fluid system 400 may define a portion of a thermal management system 200 and a second pericritical fluid system 400 may define a portion of a fuel system 300. As shown in FIG. 4, a pericritical fluid system 400 may include one or more sensors 402 configured to generate sensor outputs 404 corresponding to one or more phase properties of a fluid 401. The fluid 401 may include a cooling fluid 206 associated with a thermal management system 200, such as described herein with references to FIGS. 2A-2E. Additionally, or in the alternative, the fluid 401 may include a fuel 306 associated with a fuel system 300, such as described herein with reference to FIGS. 3A and 3B. The fluid 401 may include a pericritical fluid, such as a supercritical fluid and/or a near-supercritical fluid. Additionally, or in the alternative, the fluid 401 may include a liquid and/or a gas. Additionally, or in the alternative, the fluid 401 may include a multimodal fluid.

The sensor outputs 404 may be transmitted to the control system 600. The one or more sensors 402 and/or the control system 600 may generate fluid monitoring data 406 based at least in part on the sensor outputs 404. Additionally, or in the alternative, the fluid monitoring data 406 may include the sensor outputs 404. The sensor outputs 404 and/or the fluid monitoring data 406 that may be utilized, for example, by the control system 600, to determine one or more phase properties the fluid 401. The fluid monitoring data 406 may include one or more phase properties of the fluid 401, such as one or more phase properties of the fluid 401 determined from the sensor outputs 404. Additionally, or in the alternative, the control system 600 may utilize the fluid monitoring data 406 to control one or more controllable components 408, for example, to adjust and/or maintain a desired phase property of the fluid 401.

As shown in FIG. 4, the one or more sensors 402 may include one or more phase detection sensors 410. Additionally, or in the alternative, the one or more sensors 402 may include one or more temperature sensors 412. Additionally, or in the alternative, the one or more sensors 402 may include one or more pressure sensors 414. The one or more sensors 402 may be respectively configured to generate sensor outputs 404 that may be transmitted to the control system 600. The sensor outputs 404 from respective ones of a plurality of sensors 402 may be combined, for example, to generate fluid monitoring data 406. Additionally, or in the alternative, fluid monitoring data 406 may be generated based at least in part on sensor outputs 404 from a plurality of sensors 402. Additionally, or in the alternative, fluid monitoring data 406 may be generated based at least in part on a comparison of one or more sensor outputs 404 to other data, such as a look-up table, a model, or the like, and/or based at least in part on one or more operations performed upon the one or more sensor outputs 404, for example, based at least in part on such a look-up table, a model, or the like.

The one or more phase detection sensors 410 may include any suitable sensor configured to generate sensor outputs 404 from which one or more phase properties of the fluid 401 may be determined. In some embodiments, one or more phase properties of the fluid 401 may be determined from sensor outputs 404 generated by a phase detection sensors 410, for example, without reference to other data. Additionally, or in the alternative, one or more phase properties of the fluid 401 may be determined based at least in part on sensor outputs 404 generated by a phase detection sensor 410 and at least in part on data from another source, such as additional sensor outputs 404 from one or more other sensors 402, fluid monitoring data 406, a look-up table, a model, or the like.

In some embodiments, sensor outputs 404 generated by a phase detection sensor 410 may exhibit a change in sensor output 404 values, such as an abrupt change in sensor output 404 values, when a phase boundary is crossed as a result of a change in temperature and/or pressure. The change in sensor output 404 values exhibited by the sensor outputs 404 generated by the phase detection sensor 410 may include sensor output 404 values above an upper threshold value, sensor output 404 values below a lower threshold value, sensor output 404 values exhibiting a rate of change value above an upper threshold rate of change value, sensor output 404 values exhibiting a rate of change value below an upper threshold rate of change value, or the like, as well as combinations of these.

In some embodiments, a phase detection sensor 410 may include an acoustic sensor, such as a speed of sound sensor or an acoustic wave sensor. An exemplary speed of sound sensor may be configured to determine a velocity of a sound wave propagating through the fluid 401. The speed of sound sensor may include a transducer, such as an ultrasonic transducer, configured to emit sound waves, such as ultrasonic sound waves. The speed of sound sensor may include a receiver configured to receive the sound waves and covert the sound waves into electrical signals. The transducer and the receiver may be integrated in to a common component or may be provided as separate components. The sensor outputs 404 from a phase detection sensor 410 such as a speed of sound sensor may include electrical signals corresponding to sound waves received by the speed of sound sensor. In some embodiments, the velocity of sound waves, such as ultrasonic sound waves propagating through the fluid may depend at least in part on one or more phase properties of the fluid. In some embodiments, the velocity of the sound waves may approach a minimum at about the critical point of the fluid. One or more phase properties of the fluid 401 may correlate to sensor outputs 404 from a phase detection sensor 410 such as a speed of sound sensor.

An acoustic wave sensor may be configured to apply an oscillating electric field to generate acoustic waves that propagate through a piezoelectric substrate.

Suitable piezoelectric substrates may include quartz, lithium tantalate, lithium niobate, gallium arsenide, silicon carbide, langasite, zinc oxide, aluminum nitride, lead zirconium titanate, polyvinylidene fluoride, as well as combinations of these. The acoustic waves are converted back to electrical signals. Exemplary acoustic wave sensors include bulk acoustic wave sensors, surface acoustic wave sensors, and the like. An exemplary acoustic wave sensor may include a piezoelectric substrate. The sensor outputs 404 from a phase detection sensor 410 such as an acoustic wave sensor may include electrical signals corresponding to the acoustic waves propagating through the piezoelectric substrate. Exemplary acoustic wave sensors include bulk acoustic wave sensors, such as thickness shear mode sensors, shear-horizontal acoustic plate mode sensors, shear-horizontal surface acoustic wave sensors. Thickness shear mode sensors are sometimes referred to as quartz crystal microbalance resonator. Advantageously, the acoustic waves generated by such bulk acoustic wave sensors propagate in the shear-horizontal direction, which avoids radiating appreciable acoustic energy into the fluid 401. In some embodiments, a surface acoustic wave sensor may radiate acoustic waves into the fluid 401, causing damping of the acoustic waves.

One or more properties of the acoustic waves propagating through the piezoelectric substrate, such as frequency, amplitude, or phase, as well as a combination of these, may depend at least in part on one or more phase properties of the fluid 401. One or more phase properties of the fluid 401 may correlate to sensor outputs 404 from a phase detection sensor 410 such as an acoustic wave sensor. An impedance minimum of an equivalent circuit of the acoustic wave sensor may be proportional to the density and viscosity of the fluid 401. In some embodiments, an impedance minimum exhibited by an acoustic wave sensor may be proportional to the density and viscosity of the fluid 401 according to the following relationship: $Z_{min} \propto (\rho \eta)^{1/2}$, where $Z_{min}$ is the impedance minimum, p is the density of the fluid 401, and η is the viscosity of the fluid.

In some embodiments, impedance values from a phase detection sensor 410, such as an acoustic wave sensor, may exhibit respectively different characteristics in relation to a vaporization curve, such as liquid saturation curve and/or a vapor saturation curve of a fluid 401. For example, the impedance values from an acoustic wave sensor may exhibit an inflection point representing a moderate increase when a fluid 401 reaches a bubble point (liquid saturation point). The moderate increase in impedance values may be attributable to bubbles forming upon a surface of the acoustic wave sensor, such as upon a surface of the piezoelectric substrate. Additionally, or in the alternative, the impedance values from an acoustic wave sensor may exhibit an inflection point representing a significant increase when a fluid 401 reaches a dew point (vapor saturation point). The significant increase in impedance values may be attributable to condensate forming upon a surface of the acoustic wave sensor, such as upon a surface of the piezoelectric substrate. For a bimodal or multimodal fluid 401, the impedance values from an acoustic wave sensor may exhibit multiple inflection points respectively corresponding to the component parts of the bimodal or multimodal fluid 401.

Exemplary phase detection sensor 410, such as acoustic wave sensors, are sensitive to very small changes in the quantity of bubbles or condensate in the fluid 401. For example, such bubbles or condensate may accumulate on a surface of an acoustic wave sensor. Such changes the quantity of bubbles or condensate may yield appreciable changes in sensor outputs 404, such as impedance values, from the phase detection sensor 410. In some embodiments, a bubble point may be distinguished from a dew point based at least in part on a change in sensor output 404 values, such as a change in impedance values. Additionally, or in the alternative, a critical point may be determined based at least in part on a change in sensor output 404 values, such as a change in impedance values. Additionally, or in the alternative, a proximity of a bubble point or a dew point to the critical point may be determined based at least in part on a change in sensor output 404 values, such as a change in impedance values. For example, the closer a bubble point or dew point to the critical point, the smaller the change in sensor output 404 values upon reaching the bubble point or dew point, respectively. In some embodiments, the change in sensor output 404 values at the critical point may be approximately zero.

In some embodiments, a phase detection sensor 410 may include an optical sensor, such as a fiber-optic reflectometer or an infrared spectrometer. An exemplary fiber-optic reflectometer may include a light source configured to generate a probe beam, an optical fiber configured to introduce the probe beam into a measuring chamber, and a photodiode configured to measure an intensity of the probe beam. The probe beam may pass through the fluid 401 and thereafter may become incident upon the photodiode. Transmission, reflection, and/or refraction of the probe beam may depend at least in part on one or more phase properties of the fluid 401. The intensity of the probe beam may be compared to a reference value and/or to a reference beam emitted by the light source. By way of example, the reference beam may be split from the probe beam by a beam splitter and may become incident upon a photodiode. The reference beam may be monitored by a reference photodiode, for example, to compensate for intensity variations and the like. In some embodiments, a fiber-optic reflectometer may include one or more microstructure optical fibers that include a core material and a plurality of channels defined within the core material through which light may be guided by way of total internal reflection and/or constructive interference of scattered light. Exemplary microstructure optical fibers include photonic-crystal fibers, photonic-bandgap fibers, holey fibers, hole-assisted fibers, and Bragg fibers.

The sensor response of a phase detection sensor 410, such as a fiber-optic reflectometer, may depend at least in part on one or more phase properties of the fluid 401. One or more phase properties of the fluid 401 may correlate to sensor outputs 404 from a phase detection sensor 410 such as a fiber-optic reflectometer. In some embodiments, one or more phase properties of the fluid 401 may be determined based at least in part on sensor output 404 values from a phase detection sensor 410, such as a fiber-optic reflectometer. For example, a fluid 401 may exhibit a different refractive index depending on a phase state of the fluid 401. For example, a refractive index of a fluid 401 may differ as between at least two of: a liquid phase state, a gas phase state, a pericritical phase state, a supercritical phase state, and a near-supercritical phase state. Additionally, or in the alternative, a refractive index of a fluid 401 may differ as between at least two different phase states within a phase, such as within a liquid phase, a gas phase, a pericritical phase, a supercritical phase, and/or a near-supercritical phase. Additionally, or in the alternative, a refractive index of a fluid 401 may depend at least in part on one or more other phase properties of a fluid 401, such as a density of the fluid 401.

Additionally, or in the alternative, one or more phase properties of the fluid 401 may be determined based at least in part on a level of noise or deviation in sensor output 404 values from a phase detection sensor 410 such as a fiber-optic reflectometer. For example, a level of noise or deviation in sensor output 404 values may increase as a result of phase separation. The increase in noise or deviation may be attributable to differences in refractive index, for example, as between bubbles and condensate in the fluid 401, as between a phase of the fluid 401 and bubbles present in the phase of the fluid 401, and/or as between a phase of the fluid 401 and condensate present in the phase of the fluid 401. A level of noise or deviation in sensor output 404 values may additionally or alternatively increase for a fluid 401 that has a multiphasic state, for example, as a result of phase separation of one or more components in the fluid 401. In some embodiments, a refractive index of the fluid 401 may increase when a phase state of the fluid 401 reaches a vaporization curve and/or a vapor point on the vaporization curve, such as a liquid saturation curve and/or a bubble point on the liquid saturation curve, such as when the phase state of the fluid 401 crosses the vaporization curve. Additionally, or in the alternative, a refractive index of the fluid 401 may decrease when a phase state of the fluid 401 reaches a vapor saturation curve and/or a dew point on the vapor saturation curve, such as when the phase state of the fluid 401 crosses the vapor saturation curve from a gaseous state. Advantageously, a level of noise or deviation in sensor output 404 values from a phase detection sensor 410, such as a fiber-optic reflectometer, may be utilized to delineate respectively different phase states of a multimodal fluid, such as a multimodal fluid that exhibits a multiphasic state.

An exemplary infrared spectrometer may include a transmission infrared spectrometer, or an attenuated total reflection infrared spectrometer. An exemplary infrared spectrometer may include an infrared light source, a measurement window configured to be in contact with the fluid 401, and an infrared detector such as a photodiode configured to detect infrared light transmitted through the measurement window. An infrared spectrometer, such as an attenuated total reflection infrared spectrometer may be configured to detect total internal reflection. The infrared beam generates evanescent waves at reflection nodes where the infrared beam reflects from the internal surface of the measurement window in contact with the fluid 401. The penetration depth of the evanescent waves may depend at least in part on one or more phase properties of the fluid 401. By way of example, the penetration depth of a fluid 401 in the gaseous phase may be greater than the penetration depth of the fluid 401 in the liquid phase. A change in intensity detected by the infrared detector may indicate a phase change. Additionally, or in the alternative, an absorbance intensity may correspond to a wavenumber depends at least in part on one or more phase properties of the fluid 401. For example, a respectively different phase states of a fluid 401 may exhibit a peak absorbance at respectively different wavenumbers. Additionally, or in the alternative, an absorbance intensity may depend at least in part on a proximity of a phase state of the fluid 401 to a vaporization curve, such as vapor saturation curve and/or a liquid saturation curve. For example, an absorbance intensity may increase as a phase state of the fluid 401 approaches the vaporization curve, such as the vapor saturation curve and/or the liquid saturation curve. Additionally, or in the alternative, fluid combinations, such as bimodal and/or multimodal fluids may exhibit respectively different absorbance intensity values and/or peak absorbance at respectively different wavenumbers, such that one or more phase properties of respective parts of a bimodal and/or multimodal fluid 401 may be determined from sensor outputs 404 from a phase detection sensor 410 such as an attenuated total reflection infrared spectrometer or other infrared spectrometer.

In some embodiments, a phase detection sensor 410 may include a pressure drop sensor, such as a micro-channel pressure drop sensor, or a packed-bed pressure drop sensor. A pressure drop sensor may include a sample pathway through which a fluid 401 may flow. The fluid 401 may exhibit a pressured drop due to friction of the fluid interacting with surfaces of the microchannels, packed bed, or the like. The pressure drop across the sample pathway may depend at least in part on one or more phase properties of the fluid 401. One or more phase properties of the fluid 401 may correlate to sensor outputs 404 from a phase detection sensor 410 such as a pressure drop sensor. In some embodiments, when undergoing a phase transition, a fluid 401 may exhibit a defined change in pressured drop. For example, a liquid phase may exhibit a greater pressure drop than a gaseous phase. Additionally, or in the alternative, a supercritical phase may exhibit a relatively lower pressure drop, for example, due to a lack of surface tension in the fluid 401. Additionally, or in the alternative, a multimodal fluid exhibit a greater pressure drop in a multiphasic state relative to a single-phase state, for example, due to surface tension interactions between respectively different phase states of the fluid components. Additionally, or in the alternative, a pressure drop of the fluid 401 may depend at least in part on a density of the fluid 401.

In some embodiments, one or more phase properties of the fluid 401 may be determined based at least in part on sensor outputs 404 from the one or more phase detection sensors 410 regardless of the type of phase detection sensor 410 utilized by the pericritical fluid system 400. For example, the control system 600 may be configured to determine one or more phase properties of the fluid 401 based at least in part on a correlation between sensor outputs 404 from the one or more phase detection sensors 410 and one or more phase properties of the fluid 401. By way of example, the control system 600 may include one or more models, lookup tables, or the like that correlate sensor outputs 404 from the one or more phase detection sensors 410 and one or more phase properties of the fluid 401. Additionally, or in the alternative, in some embodiments, sensor outputs 404 from one or more phase detection sensors 410 may be utilized in combination with sensor outputs 404 from one or more temperature sensors 412 and/or one or more pressure sensors 414. For example, one or more phase properties of the fluid 401 based at least in part on a correlation between sensor outputs 404 from the one or more phase detection sensors 410 and sensor outputs 404 from the one or more temperature sensors 412 and/or one or more pressure sensors 414. In some embodiments, sensor outputs 404 from the one or more temperature sensors 412 and/or one or more pressure sensors 414 may be utilized in combination with sensor outputs 404 from one or more phase detection sensors 410 to determine one or more phase properties of the fluid 401, for example, without correlating the sensor outputs 404 from the one or more phase detection sensors 410 to the phase property of the fluid 401 being determined. For example, a change in value of the sensor outputs 404 from a phase detection sensor 410 may indicate an occurrence of a phase change, and the sensor outputs 404 from the one or more temperature sensors 412 and/or one or more pressure sensors 414 may be utilized to determine a phase state corresponding to the phase change indicated by the change in value of the sensor outputs 404 from a phase detection sensor 410. In some embodiments, the controller may be configured to determine, based at least in part on the sensor outputs 404 from the one or more temperature sensors 412 and/or one or more pressure sensors 414, whether the phase state corresponding to the phase change includes a liquid phase state, a gas phase state, a pericritical phase state, a supercritical phase state, a near-supercritical phase state, or a multiphasic state. As another example, sensor outputs 404 from the one or more temperature sensors 412 and/or one or more pressure sensors 414 may be utilized in combination with sensor outputs 404 from one or more phase detection sensors 410 to differentiate between one or more of: a vapor saturation curve and a liquid saturation curve, a dew point and a bubble point, a critical point and a dew point or a bubble point, a bubble point and a cricondenbar, and/or a dew point and a circumcenter. Additionally, or in the alternative, in some embodiments, a phase state corresponding to a phase change indicated by the change in value of the sensor outputs 404 from a phase detection sensor 410 may be determined without reference to sensor outputs 404 from the one or more temperature sensors 412 and/or one or more pressure sensors 414, for example, by way of a correlation between one or more phase properties of the fluid 401 and the sensor outputs from the phase detection sensor 410. Additionally, or in the alternative, in some embodiments, one or more phase properties of the fluid 401 may be determined based at least in part on sensor outputs 404 from the one or more phase detection sensors 410, without requiring sensor outputs 404 from one or more temperature sensors 412 nor from one or more pressure sensors 414.

Regardless of the particular configuration of the pericritical fluid system 400 in accordance with the present disclosure, the control system 600 may be configured to determine one or more phase properties of the fluid 401 based at least in part on one or more sensor outputs 404, such as sensor outputs 404 from the one or more phase detection sensors 410, and/or based at least in part on sensor outputs 404 from the one or more phase detection sensors 410 in combination with sensor outputs 404 from one or more temperature sensors 412 and/or pressure sensors 414. The one or more phase properties of the fluid 401 may be determined based at least in part on a correlation between one or more sensor outputs 404 from the one or more phase detection sensors 410 and the one or more phase properties of the fluid 401, alone and/or in combination with one or more sensor output 404 values from or more temperature sensors 412 and/or one or more pressure sensors 414. The one or more phase properties of the fluid 401 may be determined based at least in part on a model, a lookup table, or the like, for example, that utilizes the one or more sensor outputs 404 as inputs for determining the one or more phase properties of the fluid 401.

In some embodiments, the control system 600 may be configured to determine a phase state of the fluid 401 based at least in part on the sensor outputs 404, such as whether the fluid 401 exhibits a liquid phase state, a gaseous phase state, a pericritical phase state, a supercritical phase state, a near-supercritical phase state, and/or a multiphasic state, and/or a proximity of the phase state of the fluid 401 to such a phase state. Additionally, or in the alternative, the control system 600 may be configured to determine a phase state of the fluid 401 coinciding with, and/or a proximity with respect to one or more of: a vaporization curve, a vapor point, a vapor saturation curve, a dew point, a liquid saturation curve, a bubble point, a critical point, a cricondenbar, and/or a circumcenter. In some embodiments, the control system 600 may be configured to determine a density of the fluid 401 based at least in part on such sensor outputs 404. In some embodiments, for bimodal or multimodal fluids 401, the control system 600 may be configured to determine a phase state of respective components parts of the bimodal or multimodal fluid 401, such as whether a respective portion and/or portions of the fluid 401 exhibit a liquid phase state, a gaseous phase state, a pericritical phase state, a supercritical phase state, a near-supercritical phase state, and/or a multiphasic state, and/or a proximity of the phase state of the respective portion and/or portions of the fluid 401 to such a phase state. Additionally, or in the alternative, for bimodal or multimodal fluids 401, the control system 600 may be configured to determine a phase state of a respective portion and/or portions of the fluid 401 coinciding with, and/or a proximity with respect to one or more of: a vaporization curve, a vapor point, a vapor saturation curve, a dew point, a liquid saturation curve, a bubble point, a critical point, a cricondenbar, and/or a circumcenter. Additionally, or in the alternative, for a bimodal or multimodal fluid 401, the control system 600 may be configured to determine a bulk density of such bimodal or multimodal fluid 401, and/or a density of the component parts of such bimodal or multimodal fluid 401, based at least in part on such sensor outputs 404.

In some embodiments, the control system 600 may be configured to control one or more controllable components 408 based at least in part on one or more sensor outputs 404 and/or based at least in part on one or more phase properties of the fluid 401 determined from such sensor output 404 values. For example, a controllable component 408 may be configured to control one or more phase properties of a fluid 401 based at least in part on control commands 409 from the control system 600. In some embodiments, the one or more controllable components 408 may be configured to change a temperature and/or a pressure of the fluid 401. Additionally, or in the alternative, the one or more controllable components 408 may be configured to change a flow rate of the fluid 401. The change in temperature, pressure, and/or flow rate of the fluid 401 imparted by the control system 600 may be effective to change and/or maintain a phase state of the fluid 401. Additionally, or in the alternative, the change in temperature, pressure, and/or flow rate of the fluid 401 imparted by the control system 600 may be effective to change and/or maintain a density of the fluid 401, for example, with respect to a respective phase state of the fluid 401. In some embodiments, the control system 600 may be configured to maintain the fluid 401 in a pericritical phase state, such as a supercritical phase state and/or a near-supercritical phase state, for example, by controlling the controllable component. Additionally, or in the alternative, the control system 600 may be configured to maintain the phase state of the fluid 401 within a specified control range. The specified control range may include an upper control limit and/or a lower control limit. The desired range may be selected based at least in part on a desire density range of the fluid. Additionally, or in the alternative, the desired range may be selected based at least in part on one or more of: a vaporization curve, a vapor point, a vapor saturation curve, a dew point, a liquid saturation curve, a bubble point, a critical point, a cricondenbar, and/or a circumcenter. For example, a desired range may be selected at least in part to maintain the fluid 401 at desired phase state, such as a phase state that has a desired proximity with respect to such vapor saturation curve, dew point, liquid saturation curve, bubble point, critical point, cricondenbar, and/or circumcenter. Such desired proximity may be selected at least in part to avoid the fluid 401 incurring a phase change, for example, as a result of changing operating conditions of the power generation system 100 and/or engine 102.

Exemplary controllable components 408 that may be controlled by the control system 600 may include any component that may be controlled to change a temperature, a pressure, and/or a flow rate of the fluid. For example, a controllable component 408 may include one or more of: a control valve, a compressor, a pump, and/or an accumulator. In some embodiments, a controllable component 408 may include one or more cooling fluid-control valves 224 configured to control a flow of a fluid 401, such as a cooling fluid 206 flowing through a cooling circuit 208. Additionally, or in the alternative, a controllable component 408 may include one or more fuel-control valves 310 configured to control a flow of fuel 306 flowing through a fuel pathway 302. Additionally, or in the alternative, in some embodiments, a controllable component 408 may include a pump 212 configured to circulate a fluid 401, such as a pump 212 configured to circulate a cooling fluid 206 through the cooling circuit 208, and/or a pump 212 configured to supply fuel 306 to a fuel pathway 302. In some embodiments, a controllable component 408 may include one or more components of a refrigeration system 214 configured to bring the fuel 306 to a pericritical phase state and/or maintain the fuel 306 at a pericritical phase state, such as a supercritical phase state and/or a near-supercritical phase state. Additionally, or in the alternative, in some embodiments, a controllable component 408 may include one or more fluid stream-control valves 226 configured to control a flow of a fluid stream 204 flowing through a heat exchanger 202, such as a variable geometry inlet duct 234 configured to control the flow of intake air 230 flowing through a precooler 232, or such as a bleed air-control valve 240 configured to control a flow of compressor bleed air 236 flowing through a bleed air-heat exchanger 238, or such as a primary cooling fluid-control valves 254 configured to control a flow of primary cooling fluid 248 flowing through a primary cooling circuit 244.

Figure 5A:
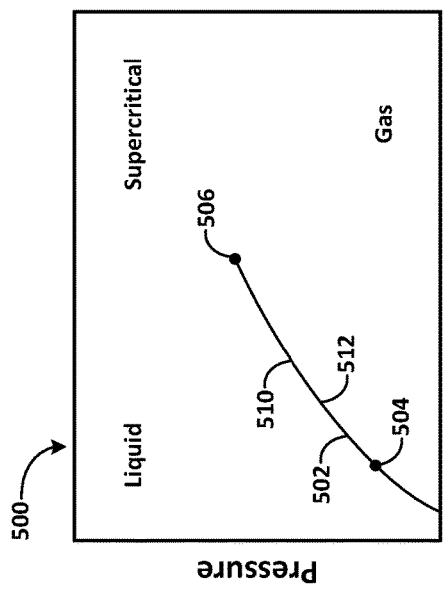
FIGS. 5A-5D schematically depict exemplary phase diagrams for a fluid in relation to temperature and pressure.
Figure 5B:
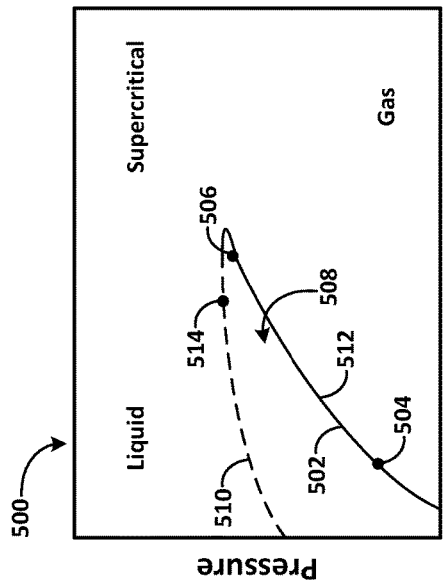
Figure 5C:
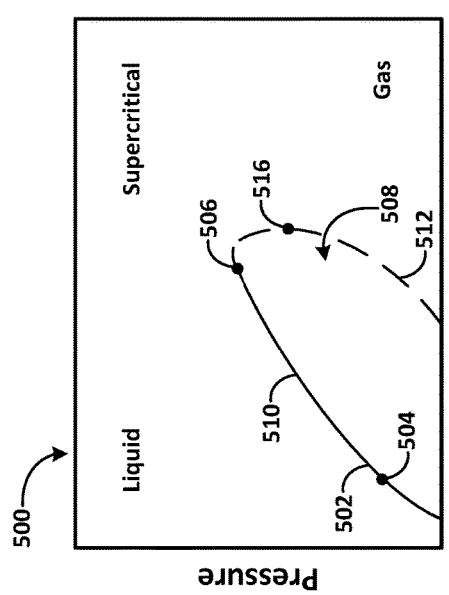
Figure 5D:
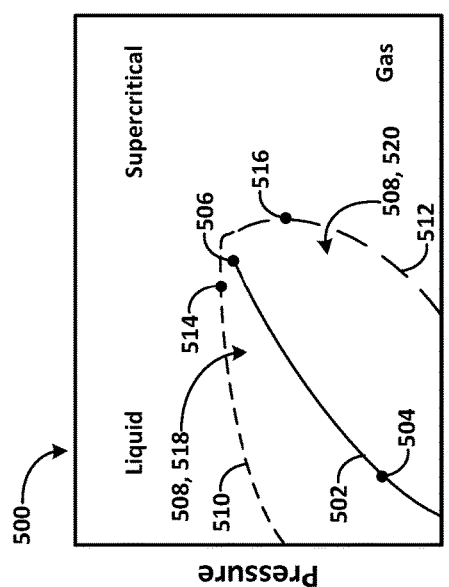
Figure 5E:
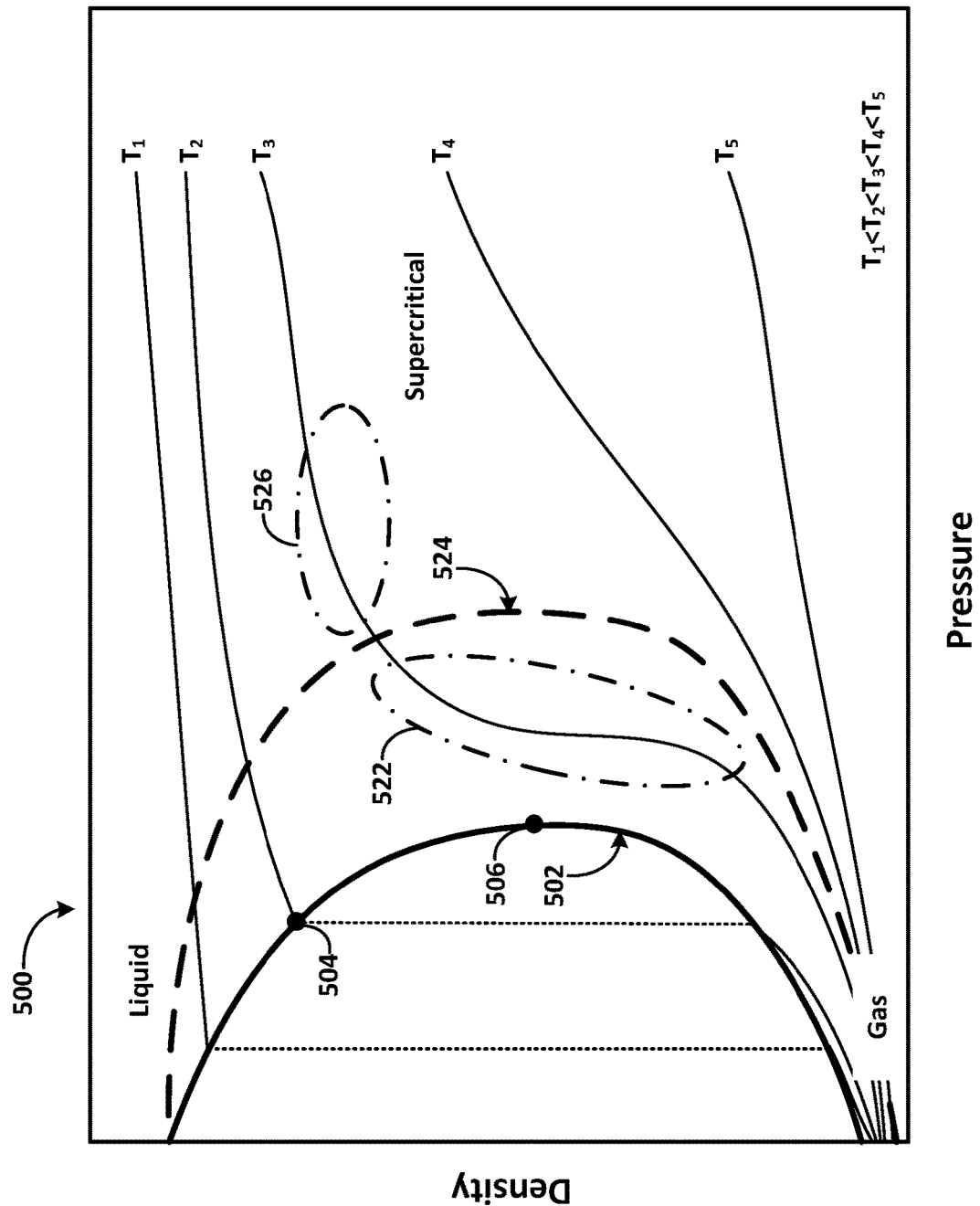
FIG. 5E schematically depicts an exemplary phase diagrams for a fluid in relation to pressure and density.

Referring now to FIGS. 5A-5E, exemplary phase diagrams 500 for a fluid 401 are described. The fluid 401 may be a cooling fluid 206 and/or a fuel 306. FIGS. 5A-5D show phase diagrams of a fluid 401 in relation to temperature and pressure. FIG. 5E show a phase diagram of a fluid in relation to pressure and density. As shown, a phase diagram for a fluid 401 may include a vaporization curve 502 defined by a plurality of vapor points 504. At a pressure above the vaporization curve, the fluid may have a liquid phase. At a pressure below the vaporization curve, the fluid may have a gas phase. At a temperature to the right of the vaporization curve, the fluid may have a gas phase. At a temperature to the left of the vaporization curve, the fluid may have a liquid phase. The vaporization curve 502 may terminate at a critical point 506. The fluid 401 may have a supercritical phase state when the fluid has a temperature and pressure that exceeds the critical point of the fluid. Except when the fluid 401 exhibits a supercritical phase state, the fluid 401 may exhibit a near-supercritical phase state when the fluid 401 has a temperature that is at least 70% of the critical temperature of the fluid 401 and a pressure that is at least 70% of the critical pressure of the fluid 401. The fluid 401 may have a pericritical phase state when the fluid exhibits a supercritical phase or a near-supercritical phase.

The phase diagram shown in FIG. 5A may correspond to a fluid 401 that has a single component, such as a first component. By way of example, in some embodiments, the first fluid-component may be carbon dioxide. The phase diagrams shown in FIGS. 5B and 5C may correspond to a bimodal fluid 401. The bimodal fluid 401 may include the first fluid-component and a second fluid-component. By way of example, in some embodiments, the first fluid-component may be carbon dioxide and the second fluid-component may be nitrogen. The phase diagram shown in FIG. 5D may correspond to a multimodal fluid 401. The multimodal fluid 401 may include the first fluid-component, the second fluid-component, and a third fluid. By way of example, in some embodiments, the first fluid-component may be carbon dioxide, the second fluid-component may be nitrogen, and the third fluid may be ethane. As shown in FIGS. 5B-5D, a bimodal fluid 401 or a multimodal fluid 401 may include a multiphasic region 508 within which the fluid 401 may include both a liquid phase and a gas phase. The multiphasic region may be delimited by a liquid saturation curve 510 and a vapor saturation curve 512. The liquid saturation curve 510 may be defined by a plurality of bubble points representing a liquid phase transitions to a gas phase. The plurality of bubble points may include a cricondenbar 514 representing a maximum pressure above which no gas can be formed regardless of the temperature. The temperature corresponding to a cricondenbar 514 may be referred to as a cricondenbar temperature. The vapor saturation curve 512 may be defined by a plurality of dew points representing a gas phase transitions to a liquid phase. The plurality of dew points may include a cricondentherm 516 representing a maximum temperature above which liquid cannot be formed regardless of the pressure. The pressure corresponding to a cricondentherm 516 may be referred to as a cricondentherm pressure. For a single component fluid, as shown, for example, in FIG. 5A, the liquid saturation curve 510 and the vapor saturation curve 512 may coincide with the vaporization curve 502, and the plurality of vapor points 504 respectively correspond to the plurality of bubble points and the plurality of dew points.

As shown in FIG. 5B, a bimodal fluid 401 may include a first fluid-component and a second fluid-component. A multiphasic region 508 for the bimodal fluid 401 may be delimited by a vapor saturation curve 512 defined by a plurality of dew points representing a transition of the first fluid-component from a gas phase to a liquid phase, a liquid saturation curve 510 defined by a plurality of bubble points representing a transition of the second fluid-component from a liquid phase to a gas phase. In some embodiments, within the multiphasic region 508 shown in FIG. 5B, the first fluid-component may have a liquid phase state and the second fluid-component may have a gas phase state. Additionally, or in the alternative, as shown in FIG. 5C, a bimodal fluid 401 may include a first fluid-component and a third fluid. A multiphasic region 508 for the bimodal fluid 401 may be delimited by a liquid saturation curve 510 defined by a plurality of bubble points representing a transition of the first fluid-component from a liquid phase to a gas phase, and a vapor saturation curve 512 defined by a plurality of dew points representing a transition of the third fluid from a gas phase to a liquid phase. In some embodiments, within the multiphasic region 508 shown in FIG. 5C, the first fluid-component may have a gas phase state and the third fluid-component may have a liquid phase state.

Additionally, or in the alternative, as shown in FIG. 5D, a multiphasic region 508 for a multimodal fluid 401 may be delimited by a liquid saturation curve 510 defined by a plurality of bubble points representing a transition of the second fluid-component from a liquid phase to a gas phase, and a vapor saturation curve 512 defined by a plurality of dew points representing a transition of the third fluid from a gas phase to a liquid phase. In some embodiments, the multiphasic region 508 for a multimodal fluid 401, may include a first multiphasic region 518 and a second multiphasic region 520, as shown, for example, in FIG. 5D. The first multiphasic region 518 may be delimited by the liquid saturation curve 510 representing the transition of the second fluid-component from a liquid phase to a gas phase, and the vaporization curve 502 representing the transition of the first fluid-component from a gas phase to a liquid phase. Within the first multiphasic region 518 shown in FIG. 5D, the first fluid-component may have a liquid phase state, the second fluid-component may have a gas phase state, and the third fluid-component may have a liquid phase state. The second multiphasic region 520 may be delimited by the vaporization curve 502 representing the transition of the first fluid-component from a liquid phase to a gas phase, and the vapor saturation curve 512 representing the transition of the third fluid-component from a gas phase to a liquid phase. Within the second multiphasic region 520 shown in FIG. 5D, the first fluid-component may have a gas phase state, the second fluid-component may have a gas phase state, and the third fluid-component may have a liquid phase state.

In some embodiments, a control system 600 may be configured to determine one or more phase properties of a bimodal or multimodal fluid 401 corresponding to a multiphasic region of the bimodal or multimodal fluid 401, for example, based at least in part on one or more sensor outputs 404 from one or more phase detection sensors 410. For example, with reference to FIGS. 5B and 5D, a bimodal or multimodal fluid 401 may include a first fluid-component and a second fluid-component, and the control system 600 may be configured to determine one or more phase properties, such as a phase state, of the second fluid-component, for example, in relation to a liquid saturation curve 510 representing a transition of the second fluid-component from a liquid phase to a gas phase. In some embodiments, the control system 600 may be configured to determine whether the second fluid-component has a liquid phase state and/or whether the second fluid-component has a gas phase state. Additionally, or in the alternative, the control system 600 may be configured to determine whether a phase state of the second fluid-component crosses the liquid saturation curve 510 and/or a proximity of the phase state of the second fluid-component in relation to the liquid saturation curve 510. Additionally, or in the alternative, the control system 600 may be configured to determine one or more phase properties, such as a phase state, of the second fluid-component in relation to a cricondenbar 514.

As another example, with reference to FIGS. 5C and 5D, a bimodal or multimodal fluid 401 may additionally or alternatively include a first fluid-component and a third fluid-component, and the control system 600 may be configured to determine one or more phase properties, such as a phase state, of the third fluid-component, for example, in relation to a vapor saturation curve 512 representing a transition of the third fluid-component from a gas phase to a liquid phase. In some embodiments, the control system 600 may be configured to determine whether the third fluid-component has a gas phase state and/or whether the third fluid-component has a liquid phase state. Additionally, or in the alternative, the control system 600 may be configured to determine whether a phase state of the third fluid-component crosses the vapor saturation curve 512 and/or a proximity of the phase state of the third fluid-component in relation to the vapor saturation curve 512. Additionally, or in the alternative, the control system 600 may be configured to determine one or more phase properties, such as a phase state, of the third fluid-component in relation to a cricondentherm 516.

In some embodiments, the control system 600 may be configured to determine one or more phase properties, such as a phase state, with respect to a first fluid-component of a bimodal or multimodal fluid 401 based at least in part on one or more phase properties, such as a phase state, of a second fluid-component and/or a third fluid-component of the bimodal or multimodal fluid 401. In some embodiments, with reference to FIG. 4 and FIGS. 5B-5D, the control system 600 may be configured to determine one or more phase properties of the first fluid-component based at least in part on one or more sensor outputs 404 from one or more phase detection sensors 410 corresponding to one or more phase properties, such as a phase state or a phase change, with respect to the second fluid-component. For example, the phase state or phase change of the second fluid-component may be in relation to the liquid saturation curve 510, such as a phase change of the second fluid-component from a liquid phase to a gas phase. In some embodiments, the first fluid-component may have a pericritical state, such as a supercritical state or a near-supercritical state, when the second fluid-component undergoes a phase change from the liquid phase to the gas phase. Additionally, or in the alternative, the control system 600 may determine one or more phase properties of the first fluid-component based at least in part on one or more sensor outputs 404 from one or more phase detection sensors 410 indicating one or more phase properties, such as a phase state or a phase change, with respect to the third fluid-component. For example, the phase state or phase change of the third fluid-component may be in relation to the vapor saturation curve 512, such as a phase change of the third fluid-component from a gas phase to a liquid phase. In some embodiments, the first fluid-component may have a pericritical state, such as a supercritical state or a near-supercritical state, when the third fluid-component undergoes a phase change from the gas phase to the liquid phase.

In some embodiments, the control system 600 may be configured to determine a phase state of the first fluid-component based at least in part on whether the second fluid-component has a liquid phase state or a gas phase state, and/or whether a phase state of the second fluid-component crosses the liquid saturation curve 510 and/or a proximity of the phase state of the second fluid-component in relation to the liquid saturation curve 510. Additionally, or in the alternative, the control system 600 may be configured to determine a proximity of the phase state of the first fluid-component in relation to the vaporization curve 502 based at least in part on the proximity of the phase state of the second fluid-component in relation to the liquid saturation curve 510. For example, the control system 600 may be configured to determine that the first fluid-component has a phase state approaching the vaporization curve 502 based at least in part on a determination that the fluid 401 has a multiphasic state corresponding to the first multiphasic region 518. The control system 600 may determine that the fluid 401 has a multiphasic state corresponding to the first multiphasic region 518 based at least in part on one or more sensor outputs 404 indicating that the second fluid-component has a gas phase state.

In some embodiments, the control system 600 may be configured to determine a phase state of the first fluid-component based at least in part on whether the third fluid-component has a gas phase state or a liquid phase state, and/or whether a phase state of the third fluid-component crosses the vapor saturation curve 512 and/or a proximity of the phase state of the third fluid-component in relation to the vapor saturation curve 512. Additionally, or in the alternative, the control system 600 may be configured to determine a proximity of the phase state of the first fluid-component in relation to the vaporization curve 502 based at least in part on the proximity of the phase state of the third fluid-component in relation to the vapor saturation curve 512. For example, the control system 600 may be configured to determine that the first fluid-component has a phase state approaching the vaporization curve 502 based at least in part on a determination that the fluid 401 has a multiphasic state corresponding to the second multiphasic region 520. The control system 600 may determine that the fluid 401 has a multiphasic state corresponding to the second multiphasic region 520 based at least in part on one or more sensor outputs 404 indicating that the third fluid-component has a liquid phase state.

In some embodiments, the control system 600 may utilize one or more phase properties, such as a phase state, of the second fluid-component and/or the third fluid-component of a bimodal or multimodal fluid 401 as an indicator or caution for one or more phase properties, such as a phase state, of the first fluid-component. As shown in FIG. 5D, a second fluid-component and/or a third fluid-component may be selected for combination with the first fluid-component such that the vaporization curve for the first fluid-component may be at least partially surrounded by the liquid saturation curve 510 representing the transition of the second fluid-component from a liquid phase to a gas phase and/or by the vapor saturation curve 512 representing a transition of the third fluid from a gas phase to a liquid phase. Additionally, or in the alternative, the second fluid-component and/or the third fluid-component may be selected for combination with the first fluid-component such that the critical point for the first fluid-component is located be within the multiphasic region 508 for the multimodal fluid 401.

For example, a proximity of the phase state of the second fluid-component in relation to the liquid saturation curve 510, such as a determination that the fluid 401 has a multiphasic state corresponding to the first multiphasic region 518, may serve as an indicator or caution that the first fluid-component has a phase state approaching the vaporization curve 502. In some embodiments, respective ones of a plurality of bubble points defining at least a portion of the liquid saturation curve 510 of the second fluid-component may have a pressure that is greater than corresponding ones of a plurality of vapor points 504 defining at least a portion of the vaporization curve 502 of the first fluid-component at respectively corresponding temperatures. Additionally, or in the alternative, in some embodiments, the cricondenbar 514 of the liquid saturation curve 510 may correspond to a pressure that is greater than the corresponding pressure of the critical point 506 of the first fluid-component.

As another example, a proximity of the phase state of the third fluid-component in relation to the vapor saturation curve 512, such as a determination that the fluid 401 has a multiphasic state corresponding to the second multiphasic region 520, may serve as an indicator or caution that the first fluid-component has a phase state approaching the vaporization curve 502. In some embodiments, respective ones of a plurality of dew points defining at least a portion of the vapor saturation curve 512 of the third fluid-component may have a temperature that is greater than corresponding ones of a plurality of vapor points 504 defining at least a portion of the vaporization curve 502 of the first fluid-component at respectively corresponding pressures. Additionally, or in the alternative, in some embodiments, the cricondentherm 516 of the vapor saturation curve 512 may correspond to a temperature that is greater than the corresponding temperature of the critical point 506 of the first fluid-component.

The control system 600 may provide one or more control commands 409 to one or more controllable components 408 based at least in part on one or more sensor outputs 404 indicating such as phase state with respect to the second fluid-component and/or the third fluid-component. For example, in the event of a determination that the fluid 401 has a multiphasic state corresponding to the first multiphasic region 518, the control system 600 may provide one or more control commands 409 to one or more controllable components 408 configured to increase the temperature and/or pressure of the fluid 401. In some embodiments, the one or more control commands 409 responsive to a determination that the fluid 401 has a multiphasic state corresponding to the first multiphasic region 518 may be configured to cause the one or more controllable components 408 to increase the pressure of the fluid 401 above the cricondenbar 514 and/or to increase the temperature of the fluid 401 above the cricondenbar temperature. Additionally, or in the alternative, the control system 600 may provide one or more control commands 409 to one or more controllable components 408 configured to increase the temperature and/or pressure of the fluid 401 in the event of a determination that the fluid 401 has a multiphasic state corresponding to the second multiphasic region 520. In some embodiments, the one or more control commands 409 responsive to a determination that the fluid 401 has a multiphasic state corresponding to the second multiphasic region 520 may be configured to cause the one or more controllable components 408 to increase the temperature of the fluid 401 above the cricondentherm 516 and/or to increase the pressure of the fluid 401 above the cricondentherm pressure.

In some embodiments, the concentration of the first-fluid component may make up a substantial majority of the total composition of the fluid 401. The second fluid-component and/or the third fluid-component may make up a substantial minority of the total composition of the fluid 401. In some embodiments, the first-fluid component may represent the primary component in the fluid 401 utilized by the thermal management system 200 and/or the fuel system 300, as applicable. In some embodiments, the second fluid-component and/or the third fluid-component may provide no appreciable effect to the thermal management system 200 and/or to the fuel system 300, as applicable, for example, with respect to the purpose for which the fluid 401 is utilized. Additionally, or in the alternative, the second fluid-component and/or the third fluid-component may be included in the fluid 401 at a concentration sufficient for use as a tracer, such as a concentration corresponding to a trace amount, sufficient for determining one or more phase properties, such as a phase state, thereof. In other embodiments, the second fluid-component and/or the third fluid-component may be included in the fluid 401 for a purpose other than as a tracer, such as for an advantageous effect to the thermal management system 200 and/or the fuel system 300, as applicable, in addition or in the alternative to serving as a tracer. Such a second fluid-component and/or third fluid-component may nevertheless be utilized as a tracer.

In some embodiments, the first fluid-component may be included in the fluid 401 in an amount of from about 30 mol. % to about 100 mol. %, such as from about 50 mol. % to about 100 mol. %, such as from about 80 mol. % to about 100 mol. %, such as from about 80 mol. % to about 90 mol. %, such as from about 90 mol. % to about 95 mol. %, such as from about 95 mol. % to about 99 mol. %, such as from about 99 mol. % to 99.8 mol. %, such as from about 99 mol. % to 99.9 mol. %, such as from about 99 mol. % to 99.998 mol. %, or such as from about 99 mol. % to 99.999 mol. %. In some embodiments, the second fluid-component may be included in the fluid 401 in an amount of from about 0.001 mol. % to about 50 mol. %, such as from about 1 mol. % to about 20 mol. %, such as from about 1 mol. % to about 10 mol. %, such as from about 1 mol. % to about 5 mol. %, such as from about 0.1 mol. % to about 1 mol. %, or such as from about 0.001 mol. % to about 1 mol. %. In some embodiments, the third fluid-component may be included in the fluid 401 in an amount of from about 0.001 mol. % to about 50 mol. %, such as from about 1 mol. % to about 20 mol. %, such as from about 1 mol. % to about 10 mol. %, such as from about 1 mol. % to about 5 mol. %, such as from about 0.1 mol. % to about 1 mol. %, or such as from about 0.001 mol. % to about 1 mol. %. In some embodiments, a concentration of the second fluid-component or the third fluid-component corresponding to a trace amount sufficient for determining one or more phase properties, such as a phase state, may be a concentration of from about 0.001 mol. % to about 5 mol. %, such as from about 0.1 mol. % to about 1 mol. %, or such as from about 0.001 mol. % to about 1 mol. %.

Referring further to FIG. 5E, another exemplary phase diagram for a fluid 401 is shown. As shown FIG. 5E, a density of a fluid 401 may depend on a pressure of the fluid 401. In some embodiments, an isothermal change in pressure may yield a substantial change in density. The phase diagram 500 shown in FIG. 5E includes a plurality of isothermal lines ($T_1$, $T_2$, $T_3$, $T_4$, and $T_5$) for a first fluid-component of the fluid 401. As shown, the first fluid-component has a vaporization curve 502 defined by a plurality of vapor points 504. In some embodiments, as indicated, for example, by the isothermal line $T_3$, an isothermal change in pressure of the first fluid-component may yield a substantial change in density within a pericritical phase, such as within a supercritical phase and/or within a near-supercritical phase. For example, at a variable density region 522, the first-fluid component may exhibit a substantial change in density as a result of a relatively nominal change in pressure and/or temperature. The range of interest for the variable density region 522 may be selected based at least in part on one or more phase properties of the fluid 401 and/or based at least in part on one or more desired operating conditions of the thermal management system 200 and/or fuel system 300.

In some embodiments, it may be desirable to avoid substantial changes in density of a fluid 401. In some embodiments, the control system 600 may be configured to determine one or more phase properties of a first fluid-component, such as a density of the first fluid-component, based at least in part on whether a second fluid-component has a liquid phase state or a gas phase state, and/or whether the second fluid-component undergoes a phase change. In some embodiments, the second fluid-component may be utilized as a tracer for determining one or more phase properties, such as density, of the first fluid-component. As shown in FIG. 5E, a first fluid-component may have a first vaporization curve 502 and a second fluid-component may have a second vaporization curve 524. The second fluid-component may be selected based at least in part on a relationship between pressure and density of the first fluid-component, and/or based at least in part on a range of interest for the variable density region 522 of the first fluid-component. In some embodiments, the thermal management system 200 and/or the fuel system 300, as applicable, may be operated such that the fluid 401 exhibits a first phase state 526, and a decrease in pressure, such as an isothermal decrease in pressure, may result in a change in phase state, such as a phase change, of the second fluid-component. For example, the second-fluid component may undergo a phase change from a liquid phase state to a gas phase state. The change in phase state of the second fluid-component may be determined by the control system 600 based at least in part on one or more sensor outputs 404 from one or more phase detection sensors 410. The change in phase state of the second fluid-component determined by the control system 600 may provide an indicator or caution that a further change in the phase state of the fluid 401, such as a further decrease in pressure and/or an increase in temperature, may result in a significant change in density of the first fluid-component. For example, the change in phase state of the second-fluid component may provide an indication or caution that the phase state of the first fluid-component may be approaching the variable density region 522.

The control system 600 may provide one or more control commands 409 to one or more controllable components 408 based at least in part on one or more sensor outputs 404 providing an indication or caution that the phase state of the first fluid-component may be approaching the variable density region 522. For example, the control system 600 may provide one or more control commands 409 to one or more controllable components 408 configured to increase the temperature and/or pressure of the fluid 401, such as to increase the pressure and/or temperature of the fluid 401 above the cricondenbar 514 and/or cricondentherm 516.

Still referring to FIGS. 5A-5E, in some embodiments, a fluid 401 may include a first fluid-component selected from among following: carbon monoxide, carbon dioxide, ammonia, methane, methanol, ethanol, ethylene, propane, propylene, heptane, 1-octanol, 2-octanol, 2-propanol, difluoromethane, ethane, difluoroethane, tetrafluoroethene, acetone, nitrous oxide, argon, bromine, neon, hydrogen, oxygen, water, liquid natural gas, kerosene, kerosene-type jet fuel (e.g., Jet A, Jet A-1, JP-5, JP-8). Additionally, or in the alternative, in some embodiments, the fluid 401 may include a second fluid-component and/or a third fluid-component selected from among the aforementioned fluids.

In some embodiments, a fluid 401, such as a cooling fluid 206, may include a first fluid-component that is carbon dioxide, and a second fluid-component and/or a third fluid-component that may be selected from among the following: carbon monoxide, ammonia, methane, methanol, ethanol, ethylene, propane, propylene, heptane, 1-octanol, 2-octanol, 2-propanol, difluoromethane, ethane, difluoroethane, tetrafluoroethene, acetone, nitrous oxide, argon, bromine, neon, hydrogen, oxygen, and water. By way of example, in some embodiments, the first fluid-component may be carbon dioxide, and the second fluid-component may be hydrogen. As another example, in some embodiments, the first fluid-component may be carbon dioxide, the second fluid-component may be nitrous oxide, and the third fluid-component may be ethane. As another example, the first fluid-component may be carbon dioxide, the second fluid-component may be 2-proponal, and the third fluid-component may be nitrogen. As another example, the first fluid-component may be carbon dioxide, the second fluid-component may be difluoromethane, and the third fluid-component may be tetrafluoroethene. As another example, the first fluid component may be argon, and the second fluid-component may be oxygen.

As another example, in some embodiments, a fluid 401, such as a fuel 306, may include a first fluid-component that is hydrogen, and a second fluid-component and/or a third fluid-component that may be selected from among the following: carbon monoxide, carbon dioxide ammonia, methane, methanol, ethanol, ethylene, propane, propylene, heptane, 1-octanol, 2-octanol, 2-propanol, difluoromethane, ethane, difluoroethane, tetrafluoroethene, acetone, nitrous oxide, argon, bromine, neon, oxygen, water, hydrogen, methane, liquid natural gas, kerosene, and kerosene-type jet fuel (e.g., Jet A, Jet A-1, JP-5, JP-8). By way of example, the first fluid-component may be hydrogen and the second fluid-component may be neon. As another example, the first fluid-component may be 1-octanol and the second fluid-component may be 2-octanol. As another example, the first fluid-component may be kerosene and the second fluid-component may be 1-octanol. As another example, the first fluid-component may be propane and the second fluid-component may be propylene. As another example, the first fluid-component may be kerosene, the second fluid-component may be 1-octanol, and the third fluid-component may be 2-octanol.

Figure 6:
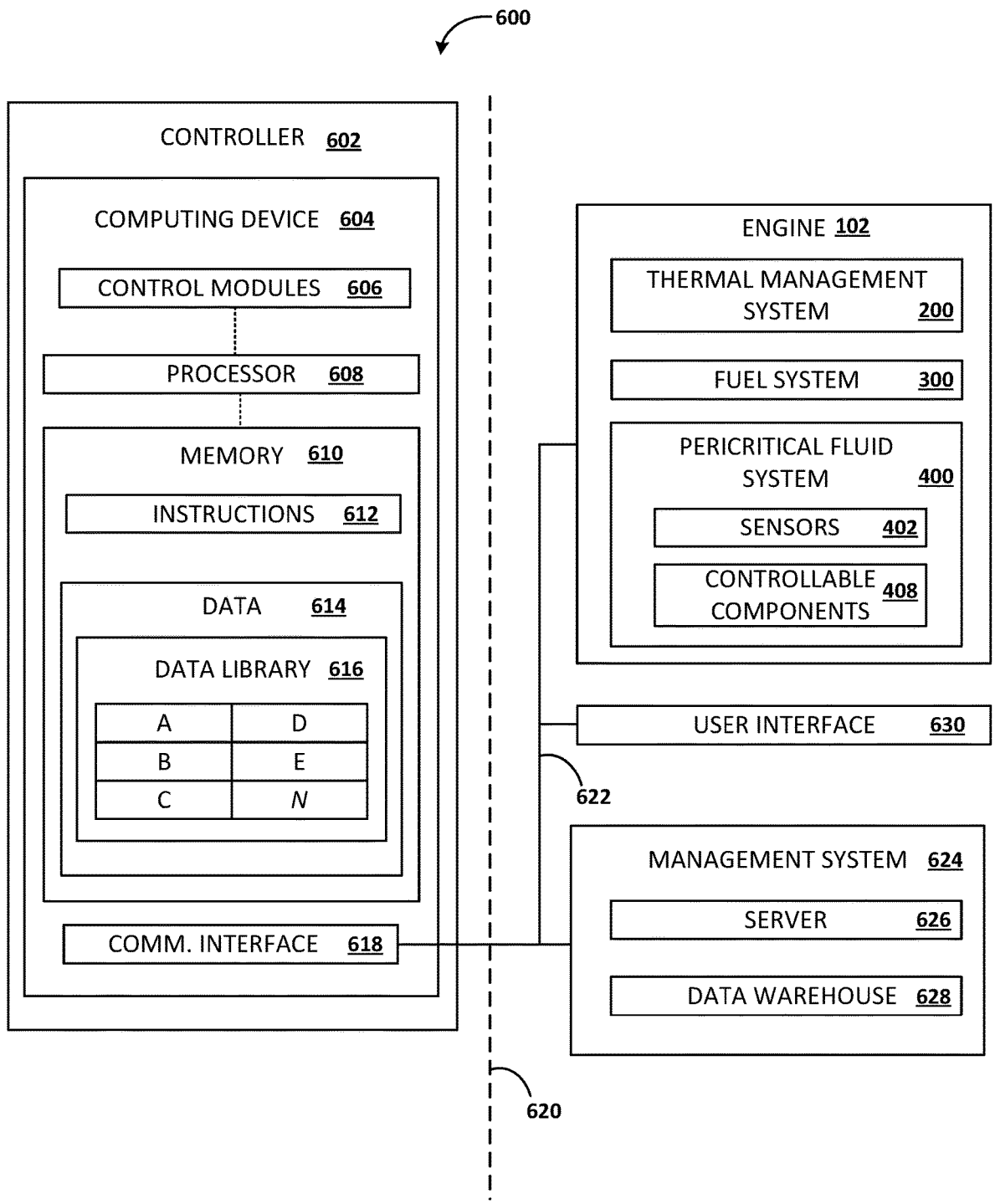
FIG. 6 schematically depicts an exemplary control system that may be utilized to perform control operations in accordance with the present disclosure.

Referring now to FIG. 6, exemplary control systems 600 are further described. An exemplary control system 600 may be utilized to monitor and/or control various features of a power generation system 100, such as various features of an engine 102, a thermal management system 200, a fuel system 300, and/or a pericritical fluid system 400. The control system 600 may be configured to perform any desired control operations in accordance with the present disclosure. As shown in FIG. 6, an exemplary control system 600 may include a controller 602, such as an electronic engine controller, a full-authority digital engine control (FADEC) device, or the like.

The controller 602 may include one or more computing devices 604 configured to perform the desired control operations. The one or more computing devices 604 may be located locally or remotely relative to the power generation system 100 and/or the engine 102. The control operations may include determining, generating, transmitting, and/or receiving sensor outputs 404 from one or more sensors 402. Additionally, or in the alternative, the control operations may include determining, generating, transmitting, and/or receiving fluid monitoring data 406, for example, based at least in part on the sensor outputs 404. Additionally, or in the alternative, the control operations may include determining, generating, transmitting, and/or receiving one or more control commands 409, for example, based at least in part on the fluid monitoring data 406 and/or the sensor outputs 404. The control commands 409 may be transmitted to one or more controllable components 408.

The computing device 604 may be communicatively coupled with the one or more sensors 402 and/or with the one or more controllable components 408. The computing device 604 may include one or more control modules 606 configured to cause the controller 602 to perform the one or more control operations, for example, based at least in part on one or more models, lookup tables, or the like.

The one or more computing devices 604 may include one or more processors 608 and one or more memory devices 610. The one or more processors 608 may include any suitable processing device, such as a microprocessor, microcontroller, integrated circuit, logic device, and/or other suitable processing device. The one or more memory devices 610 may include one or more computer-readable media, including but not limited to non-transitory computer-readable media, RAM, ROM, hard drives, flash drives, and/or other memory devices 610. The one or more control modules 606 may be implemented at least in part by the one or more processors 608 and/or the one or more memory devices 610.

As used herein, the terms "processor" and "computer" and related terms, such as "processing device" and "computing device", are not limited to just those integrated circuits referred to in the art as a computer, but broadly refers to a microcontroller, a microcomputer, a programmable logic controller (PLC), an application specific integrated circuit, and other programmable circuits, and these terms are used interchangeably herein. A memory device 610 may include, but is not limited to, a non-transitory computer-readable medium, such as a random-access memory (RAM), and computer-readable nonvolatile media, such as hard drives, flash memory, and other memory devices. Alternatively, a floppy disk, a compact disc-read only memory (CD-ROM), a magneto-optical disk (MOD), and/or a digital versatile disc (DVD) may also be used.

As used herein, the term "non-transitory computer-readable medium" is intended to be representative of any tangible computer-based device implemented in any method or technology for short-term and long-term storage of information, such as, computer-readable instructions, data structures, program modules and sub-modules, or other data in any device. The methods described herein may be encoded as executable instructions embodied in a tangible, non-transitory, computer readable media, including, without limitation, a storage device and/or a memory device. Such instructions, when executed by a processor, cause the processor to perform at least a portion of the methods described herein. Moreover, as used herein, the term "non-transitory computer-readable medium" includes all tangible, computer-readable media, including, without limitation, non-transitory computer storage devices, including, without limitation, volatile and nonvolatile media, and removable and non-removable media such as a firmware, physical and virtual storage, CD-ROMs, DVDs, and any other digital source such as a network or the Internet, as well as yet to be developed digital means, with the sole exception being a transitory, propagating signal.

The one or more memory devices 610 may store information accessible by the one or more processors 608, including computer-executable instructions 612 that can be executed by the one or more processors 608. The instructions 612 may include any set of instructions which when executed by the one or more processors 608 cause the one or more processors 608 to perform operations, including control operations. The one or more memory devices 610 may store data 614 accessible by the one or more processors 608, such as data associated with the power generation system 100, the engine 102, the thermal management system 200, the fuel system 300, and/or the pericritical fluid system 400. The data 614 may include the fluid monitoring data 406. The data 614 may include current or real-time data 614, past data 614, or a combination thereof. The data 614 may be stored in a data library 616. The data 614 may also include other data sets, parameters, outputs, information, associated with the power generation system 100, the engine 102, the thermal management system 200, the fuel system 300, and/or the pericritical fluid system 400.

The one or more computing devices 604 may also include a communication interface 618 configured to communicate with various nodes on a communication network 620 via wired or wireless communication lines 622. The communication interface 618 may include any suitable components for interfacing with one or more network(s), including for example, transmitters, receivers, ports, controllers, antennas, and/or other suitable components. The communication network 620 may include, for example, a local area network (LAN), a wide area network (WAN), SATCOM network, VHF network, a HF network, a Wi-Fi network, a WiMAX network, a gatelink network, and/or any other suitable communication network 620 for transmitting messages to and/or from the computing device 604 across the communication lines 622. The communication lines 622 of communication network 620 may include a data bus or a combination of wired and/or wireless communication links.

The control system 600 may include a management system 624 located locally or remotely relative to the power generation system 100 and/or the engine 102. The management system 624 may include a server 626 and/or a data warehouse 628. As an example, at least a portion of the data 614 may be stored in the data warehouse 628, and the server 626 may be configured to transmit data 614 from the data warehouse 628 to the one or more computing device 604, and/or to receive data 614 from the one or more computing devices 604 and to store the received data 614 in the data warehouse 628 for further purposes. The server 626 and/or the data warehouse 628 may be implemented as part of the one or more computing devices 604 and/or as part of the management system 624. The control system 600 may also include a user interface 630 configured to allow a user to interact with the various features of the control system 600, for example, by way of the communication interface 618. The communication interface 618 may allow the one or more computing devices 604 to communicate with various nodes associated with the power generation system 100 and/or the engine 102, the management system 624, and/or the user interface 630.

Figure 7:
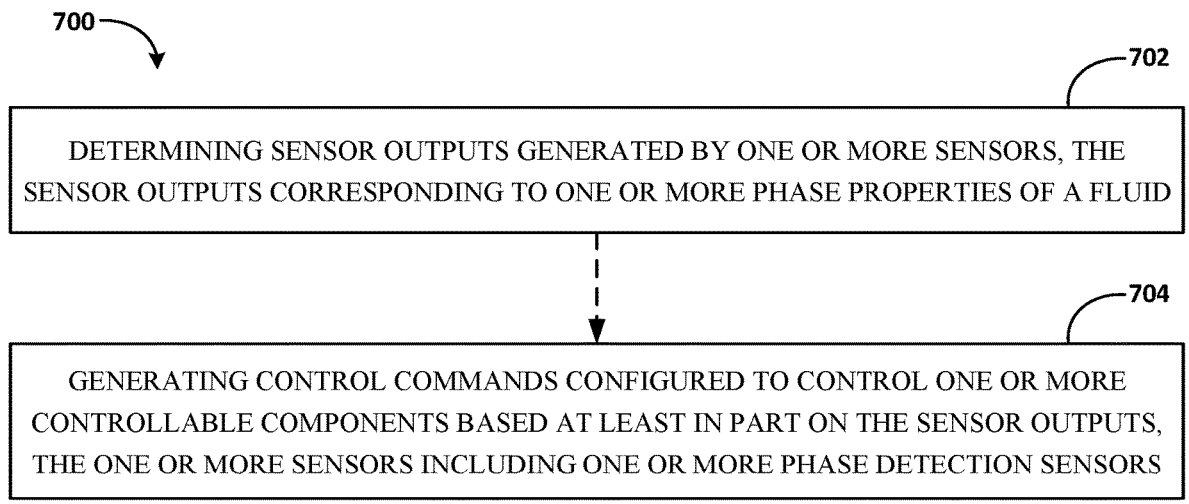
FIG. 7 shows a flow chart depicting an exemplary method of controlling a phase state of a fluid, such as in connection with a thermal management system or a fuel system.

Referring now to FIG. 7, exemplary methods in accordance with the present disclosure are further described. By way of example, an exemplary method 700 may include a method of controlling a phase state of a fluid. The exemplary method 700 may be performed in connection with a thermal management system 200 and/or in connection with a fuel system 300. Additionally, or in the alternative, the exemplary method 700 may be performed in connection with one or more operations of a power generation system 100 and/or an engine 102, such as a turbine engine.

As shown in FIG. 7, an exemplary method 700 may include, at block 702, determining sensor outputs 404 generated by one or more sensors 402. The sensor outputs may correspond to one or more phase properties of a fluid 401. The fluid 401 may be a pericritical fluid, such as a supercritical fluid or a near-supercritical fluid. In some embodiments, the fluid 401 may be a cooling fluid 206. The fluid 401, such as a cooling fluid 206, may flow through a cooling circuit 208 of a thermal management system 200. The sensor outputs 404 may be determined with respect to the fluid 401, such as a cooling fluid 206, when flowing through the cooling circuit 208, such as through one or more cooling conduits 210 or in a tank or vessel configured to supply cooling fluid 206 to the cooling circuit 208. Additionally, or in the alternative, the fluid 401 may be a fuel 306. The fluid 401, such as a fuel 306, may flow through a fuel pathway 302 of a fuel system 300. The sensor outputs 404 may be determined with respect to the fluid 401, such as a fuel 306, when flowing through the fuel pathway 302, such as through one or more fuel conduits 304 or in a fuel tank 308 configured to store the fuel 306.

At block 704, the exemplary method 700 may include generating control commands 409 configured to control one or more controllable components 408 based at least in part on the sensor outputs 404. In some embodiments, the controllable components 408 may be associated with a thermal management system 200. In some embodiments, the controllable components 408 may be associated with a fuel system 300. The one or more sensors may include one or more phase detection sensors 410. In some embodiments, the one or more phase detection sensors may include an acoustic sensor, such as a speed of sound sensor or an acoustic wave sensor. In some embodiments, the one or more phase detection sensors may include an optical sensor or a pressure drop sensor.

Accordingly, the presently disclosed systems and methods may be utilized to monitor and/or control a phase state of fluid, such as within a pericritical phase, a supercritical phase, and/or a near-supercritical phase. Further aspects of the disclosure are provided by the subject matter of the following clauses:

A pericritical fluid system for a thermal management system associated with a turbine engine, the pericritical fluid system comprising: one or more sensors configured to generate sensor outputs corresponding to one or more phase properties of a pericritical fluid flowing through a cooling circuit of the thermal management system; and a controller communicatively coupled to the one or more sensors, the controller configured to generate control commands configured to control one or more controllable components of the thermal management system based at least in part on the sensor outputs; wherein the one or more sensors comprise one or more phase detection sensors, the one or more phase detection sensors comprising an acoustic sensor.

The pericritical fluid system of any preceding clause, comprising: the one or more controllable components, wherein the one or more controllable components are respectively configured to change one or more of: a temperature of the pericritical fluid, a pressure of the pericritical fluid, and/or a flow rate of the of the pericritical fluid.

The pericritical fluid system of any preceding clause, wherein the acoustic sensor comprises a speed of sound sensor, the speed of sound sensor comprising an ultrasonic transducer configured to emit sound waves, and a receiver configured to receive the sound waves and covert the sound waves into electrical signals.

The pericritical fluid system of any preceding clause, wherein the acoustic sensor comprises an acoustic wave sensor, the acoustic wave sensor configured to apply an oscillating electric field to generate acoustic waves that propagate through a piezoelectric substrate.

The pericritical fluid system of any preceding clause, wherein the acoustic wave sensor comprises a bulk acoustic wave sensor.

The pericritical fluid system of any preceding clause, wherein the acoustic wave sensor comprises a surface acoustic wave sensor.

The pericritical fluid system of any preceding clause, wherein the controller is configured to determine one or more phase properties of the pericritical fluid based at least in part on the sensor outputs.

The pericritical fluid system of any preceding clause, wherein the controller is configured to determine one or more phase properties of the pericritical fluid based at least in part on a correlation between the sensor outputs and the one or more phase properties of the pericritical fluid.

The pericritical fluid system of any preceding clause, wherein the controller is configured to determine one or more phase properties of the pericritical fluid based at least in part on a level of noise or deviation in sensor outputs.

The pericritical fluid system of any preceding clause, wherein the one or more sensors comprise one or more temperature sensors and/or one or more pressure sensors.

The pericritical fluid system of any preceding clause, wherein the sensor outputs comprise phase detection sensor outputs generated by the one or more phase detection sensors, and at least one of: temperature sensor outputs generated by the one or more temperature sensors, and pressure sensor outputs generated by the one or more pressure sensors; and wherein the controller is configured to determine one or more phase properties of the pericritical fluid based at least in part on the phase detection sensor outputs in combination with at least one of: the temperature sensor outputs and the pressure sensor outputs.

The pericritical fluid system of any preceding clause, wherein the one or more phase properties of the pericritical fluid comprises a phase change and a phase state corresponding to the phase change, and wherein the controller is configured to determine an occurrence of the phase change based at least in part on the phase detection sensor outputs, and wherein the controller is configured to determine the phase state corresponding to the phase change based at least in part on at least one of: the temperature sensor outputs and the pressure sensor outputs.

The pericritical fluid system of any preceding clause, wherein the pericritical fluid comprises at least one of: carbon monoxide, carbon dioxide, ammonia, methane, methanol, ethanol, ethylene, propane, propylene, heptane, 1-octanol, 2-octanol, 2-propanol, difluoromethane, ethane, difluoroethane, tetrafluoroethene, acetone, nitrous oxide, argon, bromine, neon, hydrogen, oxygen, and water.

The pericritical fluid system of any preceding clause, wherein the pericritical fluid comprises a multimodal fluid, the multimodal fluid comprising a first fluid-component and a second fluid-component, and wherein the sensor outputs correspond to one or more phase properties with respect to the second fluid-component, and wherein the controller is configured to determine one or more phase properties with respect to the first fluid-component based at least in part on the sensor outputs corresponding to the one or more phase properties with respect to the second fluid-component.

The pericritical fluid system of any preceding clause, wherein the one or more phase properties with respect to the second fluid-component comprises a phase state or a phase change in relation to a liquid saturation curve representing a transition of the second fluid-component from a liquid phase to a gas phase.

The pericritical fluid system of any preceding clause, wherein the multimodal fluid comprises a third fluid-component, and wherein the sensor outputs comprise additional sensor outputs corresponding to one or more phase properties with respect to the third fluid-component, and wherein the controller is configured to determine one or more phase properties with respect to the first fluid-component based at least in part on the additional sensor outputs corresponding to the one or more phase properties with respect to the third fluid-component; wherein the one or more phase properties with respect to the third fluid-component comprises a phase state or a phase change in relation to a vapor saturation curve representing a transition of the third fluid-component from a gas phase to a liquid phase; and wherein a vaporization curve for the first fluid-component is at least partially surrounded by the liquid saturation curve and the vapor saturation curve.

The pericritical fluid system of any preceding clause, wherein the second fluid-component and/or the third fluid-component has a concentration corresponding to a trace amount sufficient for determining the one or more phase properties.

The pericritical fluid system of any preceding clause, wherein the first fluid-component comprises carbon dioxide, and the second fluid-component and/or the third fluid-component comprises at least one of: carbon monoxide, ammonia, methane, methanol, ethanol, ethylene, propane, propylene, heptane, 1-octanol, 2-octanol, 2-propanol, difluoromethane, ethane, difluoroethane, tetrafluoroethene, acetone, nitrous oxide, argon, bromine, neon, hydrogen, oxygen, water.

A liquid fuel system for a turbine engine, the liquid fuel system comprising: one or more sensors configured to generate sensor outputs corresponding to one or more phase properties of a fuel supplied to the turbine engine through a fuel pathway; and a controller communicatively coupled to the one or more sensors, the controller configured to generate control commands configured to control one or more controllable components of the liquid fuel system based at least in part on the sensor outputs, wherein the one or more sensors comprise one or more phase detection sensors; wherein the fuel comprises hydrogen, and wherein the fuel has a liquid phase state.

The liquid fuel system of any preceding clause, wherein the one or more phase detection sensors comprises: an acoustic sensor, an optical sensor, or a pressure drop sensor.

The liquid fuel system of any preceding clause, wherein the one or more phase detection sensors comprises the acoustic sensor, wherein the acoustic sensor comprises a speed of sound sensor, the speed of sound sensor comprising an ultrasonic transducer configured to emit sound waves, and a receiver configured to receive the sound waves and covert the sound waves into electrical signals.

The liquid fuel system of any preceding clause, wherein the one or more phase detection sensors comprises the acoustic sensor, wherein the acoustic sensor comprises an acoustic wave sensor, the acoustic wave sensor configured to apply an oscillating electric field to generate acoustic waves that propagate through a piezoelectric substrate.

The liquid fuel system of any preceding clause, wherein the acoustic wave sensor comprises a bulk acoustic wave sensor.

The liquid fuel system of any preceding clause, wherein the acoustic wave sensor comprises a surface acoustic wave sensor.

The liquid fuel system of any preceding clause, wherein the one or more phase detection sensors comprises the optical sensor, wherein the optical sensor comprises a fiber-optic reflectometer, the fiber-optic reflectometer comprising a light source configured to generate a probe beam, an optical fiber configured to introduce the probe beam into a measuring chamber, and a photodiode configured to measure an intensity of the probe beam.

The liquid fuel system of any preceding clause, wherein the fiber-optic reflectometer comprises one or more microstructure optical fibers, the one or more microstructure optical fibers respectively comprising a core material and a plurality of channels defined within the core material, wherein the fiber-optic reflectometer is configured to guide light through the plurality of channels by way of total internal reflection and/or constructive interference of scattered light.

The liquid fuel system of any preceding clause, wherein the one or more phase detection sensors comprises the optical sensor, wherein the optical sensor comprises an infrared spectrometer, the infrared spectrometer comprising an infrared light source, a measurement window configured to be in contact with the fuel, and an infrared detector configured to detect infrared light transmitted through the measurement window.

The liquid fuel system of any preceding clause, wherein the infrared spectrometer comprises an attenuated total reflection infrared spectrometer configured to detect total internal reflection.

The liquid fuel system of any preceding clause, wherein the one or more phase detection sensors comprises the pressure drop sensor, wherein the pressure drop sensor comprises a micro-channel pressure drop sensor, or a packed-bed pressure drop sensor.

The liquid fuel system of any preceding clause, comprising: the one or more controllable components, wherein the one or more controllable components are respectively configured to change one or more of: a temperature of the fuel, a pressure of the fuel, and/or a flow rate of the of the fuel.

The liquid fuel system of any preceding clause, wherein the controller is configured to determine one or more phase properties of the fuel based at least in part on the sensor outputs.

The liquid fuel system of any preceding clause, wherein the controller is configured to determine one or more phase properties of the fuel based at least in part on a correlation between the sensor outputs and the one or more phase properties of the fuel.

The liquid fuel system of any preceding clause, wherein the controller is configured to determine one or more phase properties of the fuel based at least in part on a level of noise or deviation in sensor outputs.

The liquid fuel system of any preceding clause, wherein the one or more sensors comprise one or more temperature sensors and/or one or more pressure sensors.

The liquid fuel system of any preceding clause, wherein the sensor outputs comprise phase detection sensor outputs generated by the one or more phase detection sensors, and at least one of: temperature sensor outputs generated by the one or more temperature sensors, and pressure sensor outputs generated by the one or more pressure sensors; and wherein the controller is configured to determine one or more phase properties of the fuel based at least in part on the phase detection sensor outputs in combination with at least one of: the temperature sensor outputs and the pressure sensor outputs.

The liquid fuel system of any preceding clause, wherein the one or more phase properties of the fuel comprises a phase change and a phase state corresponding to the phase change, and wherein the controller is configured to determine an occurrence of the phase change based at least in part on the phase detection sensor outputs, and wherein the controller is configured to determine the phase state corresponding to the phase change based at least in part on at least one of: the temperature sensor outputs and the pressure sensor outputs.

The liquid fuel system of any preceding clause, comprising: the pericritical fluid system of any preceding clause.

A turbine engine, comprising: a thermal management system configured to circulate a pericritical fluid through a cooling circuit, the thermal management system comprising one or more controllable components; one or more sensors configured to generate sensor outputs corresponding to one or more phase properties of the pericritical fluid; and a controller communicatively coupled to the one or more sensors, the controller configured to generate control commands configured to control the one or more controllable components based at least in part on the sensor outputs; wherein the one or more sensors comprise one or more phase detection sensors, the one or more phase detection sensors comprising an acoustic sensor.

A turbine engine, comprising: a liquid fuel system configured to supply a fuel to the turbine engine through a fuel pathway, the liquid fuel system comprising one or more controllable components; one or more sensors configured to generate sensor outputs corresponding to one or more phase properties of the fuel; and a controller communicatively coupled to the one or more sensors, the controller configured to generate control commands configured to control the one or more controllable components based at least in part on the sensor outputs, wherein the one or more sensors comprise one or more phase detection sensors; wherein the fuel comprises hydrogen.

The turbine engine of any preceding clause, wherein the turbine engine comprises the pericritical fluid system of any preceding clause.

The turbine engine of any preceding clause, wherein the turbine engine comprises the liquid fuel system of any preceding clause.

A non-transitory computer-readable medium comprising computer-executable instructions, which when executed by a processor, cause the processor to perform a method of controlling one or more phase properties of a pericritical fluid associated with a thermal management system for a turbine engine, the method comprising: determining sensor outputs generated by one or more sensors, the sensor outputs corresponding to one or more phase properties of a pericritical fluid flowing through a cooling circuit of the thermal management system; and generating control commands configured to control one or more controllable components of the thermal management system based at least in part on the sensor outputs; wherein the one or more sensors comprise one or more phase detection sensors, the one or more phase detection sensors comprising an acoustic sensor.

A non-transitory computer-readable medium comprising computer-executable instructions, which when executed by a processor, cause the processor to perform a method of controlling one or more phase properties of a fuel associated with a liquid fuel system for a turbine engine, the method comprising: determining sensor outputs generated by one or more sensors, the sensor outputs corresponding to one or more phase properties of a fuel supplied to the turbine engine through a fuel pathway; and generating control commands configured to control one or more controllable components of the liquid fuel system based at least in part on the sensor outputs, wherein the one or more sensors comprise one or more phase detection sensors, wherein the fuel comprises hydrogen, and wherein the fuel has a liquid phase state.

A method of controlling one or more phase properties of a pericritical fluid associated with a thermal management system for a turbine engine, the method comprising: determining sensor outputs generated by one or more sensors, the sensor outputs corresponding to one or more phase properties of a pericritical fluid flowing through a cooling circuit of the thermal management system; and generating control commands configured to control one or more controllable components of the thermal management system based at least in part on the sensor outputs; wherein the one or more sensors comprise one or more phase detection sensors, the one or more phase detection sensors comprising an acoustic sensor.

A method of controlling one or more phase properties of a fuel associated with a liquid fuel system for a turbine engine, the method comprising: determining sensor outputs generated by one or more sensors, the sensor outputs corresponding to one or more phase properties of a fuel supplied to the turbine engine through a fuel pathway; and generating control commands configured to control one or more controllable components of the liquid fuel system based at least in part on the sensor outputs, wherein the one or more sensors comprise one or more phase detection sensors, and wherein the fuel comprises hydrogen, and wherein the fuel has a liquid phase state.

The method of any preceding clause, wherein the method is performed using the pericritical fluid system of any preceding clause.

The method of any preceding clause, wherein the method is performed using the liquid fuel system of any preceding clause.

The method of any preceding clause, wherein the method is performed using the non-transitory computer-readable medium of any preceding clause.

This written description uses exemplary embodiments to describe the presently disclosed subject matter, including the best mode, and also to enable any person skilled in the art to practice such subject matter, including making and using any devices or systems and performing any incorporated methods. The patentable scope of the presently disclosed subject matter is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal languages of the claims.

What is claimed is:

1. A liquid fuel system for a turbine engine, the liquid fuel system comprising:
one or more sensors configured to generate sensor outputs corresponding to one or more phase properties of a fuel supplied to the turbine engine through a fuel pathway; and
a controller communicatively coupled to the one or more sensors, the controller configured to determine one or more phase properties of the fuel based at least in part on the sensor outputs and to generate control commands configured to control one or more controllable components of the liquid fuel system based at least in part on the sensor outputs, wherein the one or more sensors comprise one or more phase detection sensors, wherein the one or more phase detection sensors comprises an optical sensor, and wherein the one or more phase properties include a phase state of the fuel as at least one of a liquid phase state, a gas phase state, a pericritical phase state, a supercritical phase state, a near-supercritical phase state, and a multiphasic state;
wherein the fuel comprises hydrogen, and wherein the fuel has a liquid phase state; and
wherein the optical sensor comprises an infrared spectrometer, the infrared spectrometer comprising an infrared light source, a measurement window configured to be in contact with the fuel in the fuel pathway, and an infrared detector configured to detect infrared light transmitted through the measurement window.

2. The liquid fuel system of claim 1, wherein the infrared spectrometer comprises an attenuated total reflection infrared spectrometer configured to detect total internal reflection.

3. The liquid fuel system of claim 1, comprising:
the one or more controllable components, wherein the one or more controllable components are respectively configured to change one or more of: a temperature of the fuel, a pressure of the fuel, and/or a flow rate of the of the fuel.

4. The liquid fuel system of claim 1, wherein the controller is configured to determine one or more phase properties of the fuel based at least in part on a correlation between the sensor outputs and the one or more phase properties of the fuel.

5. The liquid fuel system of claim 4, wherein the controller is configured to determine one or more phase properties of the fuel based at least in part on a level of noise or deviation in sensor outputs.

6. A turbine engine, comprising:
a liquid fuel system configured to supply a fuel to the turbine engine through a fuel pathway, the liquid fuel system comprising one or more controllable components;
one or more sensors configured to generate sensor outputs corresponding to one or more phase properties of the fuel; and
a controller communicatively coupled to the one or more sensors, the controller configured to determine one or more phase properties of the fuel based at least in part on the sensor outputs and to generate control commands configured to control the one or more controllable components based at least in part on the sensor outputs, wherein the one or more sensors comprise one or more phase detection sensors, wherein the one or more phase detection sensors comprises an optical sensor, and wherein the one or more phase properties include a phase state of the fuel as at least one of a liquid phase state, a gas phase state, a pericritical phase state, a supercritical phase state, a near-supercritical phase state, and a multiphasic state;
wherein the fuel comprises hydrogen, and wherein the fuel has a liquid phase state; and
wherein the optical sensor comprises an infrared spectrometer, the infrared spectrometer comprising an infrared light source, a measurement window configured to be in contact with the fuel in the fuel pathway, and an infrared detector configured to detect infrared light transmitted through the measurement window.

7. A non-transitory computer-readable medium comprising computer-executable instructions, which when executed by a processor, cause the processor to perform a method of controlling one or more phase properties of a fuel associated with a liquid fuel system for a turbine engine, the method comprising:
determining sensor outputs generated by one or more sensors, the sensor outputs corresponding to one or more phase properties of a fuel supplied to the turbine engine through a fuel pathway, wherein the one or more sensors comprises an optical sensor, and wherein the one or more phase properties include a phase state of the fuel as at least one of a liquid phase state, a gas phase state, a pericritical phase state, a supercritical phase state, a near-supercritical phase state, and a multiphasic state; and
generating control commands configured to control one or more controllable components of the liquid fuel system based at least in part on the sensor outputs, wherein the one or more sensors comprise one or more phase detection sensors;
wherein the fuel comprises hydrogen, and wherein the fuel has a liquid phase state;
wherein the optical sensor comprises an infrared spectrometer, the infrared spectrometer comprising an infrared light source, a measurement window configured to be in contact with the fuel in the fuel pathway, and an infrared detector configured to detect infrared light transmitted through the measurement window.

* * * * *